(12) United States Patent
Zhu

(10) Patent No.: US 11,810,902 B2
(45) Date of Patent: Nov. 7, 2023

(54) SEMICONDUCTOR DEVICE WITH SIDEWALL INTERCONNECTION STRUCTURE, METHOD OF MANUFACTURING THE SAME, AND ELECTRONIC APPARATUS

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 151 days.

(21) Appl. No.: 17/548,289

(22) Filed: Dec. 10, 2021

(65) Prior Publication Data
US 2022/0189925 A1 Jun. 16, 2022

(30) Foreign Application Priority Data
Dec. 11, 2020 (CN) .......................... 202011463150.8

(51) Int. Cl.
*H01L 21/00* (2006.01)
*H01L 25/065* (2023.01)
(Continued)

(52) U.S. Cl.
CPC .... *H01L 25/0657* (2013.01); *H01L 21/76275* (2013.01); *H01L 21/76283* (2013.01);
(Continued)

(58) Field of Classification Search
CPC .......... H01L 25/0657; H01L 21/76275; H01L 21/76283
See application file for complete search history.

(56) References Cited

U.S. PATENT DOCUMENTS

| | | | | |
|---|---|---|---|---|
| 8,969,930 B2 * | 3/2015 | Yin | .......................... | H01L 29/78 257/E29.22 |
| 11,664,374 B2 * | 5/2023 | Chung | ............ | H01L 21/823878 257/365 |

(Continued)

FOREIGN PATENT DOCUMENTS

| | | | | | |
|---|---|---|---|---|---|
| CN | 110970379 A | * | 4/2020 | ....... | H01L 21/76801 |
| CN | 110993583 A | * | 4/2020 | ......... | H01L 21/7682 |

(Continued)

*Primary Examiner* — Laura M Menz
(74) *Attorney, Agent, or Firm* — Christensen, Fonder, Dardi & Herbert PLLC

(57) ABSTRACT

A semiconductor device, a method of manufacturing the semiconductor device, and an electronic apparatus including the semiconductor device are provided. The semiconductor device may include: a plurality of element stacks, wherein each element stack includes a plurality of stacked layers of semiconductor elements, each semiconductor element includes a gate electrode and source/drain regions on opposite sides of the gate electrode; and an interconnection structure between the plurality of element stacks. The interconnection structure includes an electrical isolation layer, and a conductive structure in the electrical isolation layer. At least one of the gate electrode and the source/drain regions of each of at least a part of the semiconductor elements is in contact with and therefore electrically connected to the conductive structure of the interconnection structure at a corresponding height in a lateral direction.

29 Claims, 19 Drawing Sheets

(51) Int. Cl.
  *H01L 21/762*     (2006.01)
  *H01L 21/768*     (2006.01)
  *H01L 23/528*     (2006.01)
  *H01L 23/535*     (2006.01)
  *H01L 23/544*     (2006.01)
  *H01L 25/00*      (2006.01)

(52) U.S. Cl.
  CPC ...... *H01L 21/76898* (2013.01); *H01L 23/528* (2013.01); *H01L 23/535* (2013.01); *H01L 23/544* (2013.01); *H01L 25/50* (2013.01); *H01L 2223/54426* (2013.01); *H01L 2225/06524* (2013.01); *H01L 2225/06544* (2013.01)

(56) References Cited

U.S. PATENT DOCUMENTS

| | | | | |
|---|---|---|---|---|
| 2012/0061738 A1* | 3/2012 | Yin | ........... | H01L 21/28247 257/288 |
| 2022/0189853 A1* | 6/2022 | Zhu | ........... | H01L 21/8221 |
| 2022/0189925 A1* | 6/2022 | Zhu | ........... | H01L 21/76283 |
| 2022/0189926 A1* | 6/2022 | Zhu | ........... | H01L 21/76283 |
| 2022/0254702 A1* | 8/2022 | Zhu | ........... | H01L 23/46 |
| 2022/0285506 A1* | 9/2022 | Zhu | ........... | H01L 29/516 |
| 2022/0319921 A1* | 10/2022 | Yang | ........... | H01L 21/76843 |
| 2023/0005839 A1* | 1/2023 | Zhu | ........... | H01L 21/76816 |

FOREIGN PATENT DOCUMENTS

| | | | | |
|---|---|---|---|---|
| CN | 112582374 A | * | 3/2021 | ....... H01L 21/76275 |
| CN | 112582375 A | * | 3/2021 | .......... H01L 21/4857 |
| CN | 112582376 A | * | 3/2021 | .......... H01L 21/4857 |
| CN | 112582377 A | * | 3/2021 | .......... H01L 21/4857 |
| CN | 112909012 A | * | 6/2021 | ........ H01L 27/11565 |
| CN | 112992857 A | * | 6/2021 | .......... H01L 21/4871 |
| CN | 113629061 A | * | 11/2021 | |
| CN | 113707667 A | * | 11/2021 | |
| CN | 115188728 A | * | 10/2022 | |
| TW | 202029463 A | * | 8/2020 | |
| TW | 202101684 A | * | 1/2021 | ......... H01L 23/5221 |
| WO | WO-2021109795 A1 | * | 6/2021 | ....... H01L 21/76801 |

* cited by examiner

SEMICONDUCTOR DEVICE WITH SIDEWALL INTERCONNECTION STRUCTURE, METHOD OF MANUFACTURING THE SAME, AND ELECTRONIC APPARATUS

CROSS-REFERENCE TO RELATED APPLICATION

This application claims the benefit of Chinese Patent Application No. 202011463150.8 filed on Dec. 11, 2020 in the State Intellectual Property Office of China, the whole disclosure of which is incorporated herein by reference.

TECHNICAL FIELD

The present disclosure relates to the field of semiconductors, and in particular, to a semiconductor device with a sidewall interconnection structure, a method of manufacturing the semiconductor device, and an electronic apparatus including the semiconductor device.

BACKGROUND

With the continuous miniaturization of semiconductor elements, since it is difficult to reduce sizes laterally, it is more and more difficult to manufacture high-density interconnection structures. In addition, to increase the degree of integration, a plurality of layers of elements may be stacked. It is desirable to be able to provide interconnections for such stacked elements in a flexible manner.

SUMMARY

According to one aspect of the present disclosure, a semiconductor device is provided, including: a plurality of element stacks, wherein each element stack includes a plurality of stacked layers of semiconductor elements, each semiconductor element includes a gate electrode and source/drain regions on opposite sides of the gate electrode; and an interconnection structure between the plurality of element stacks. The interconnection structure may include: an electrical isolation layer; and a conductive structure in the electrical isolation layer. At least one of the gate electrode and the source/drain regions of each of at least a part of the semiconductor elements is in contact with and therefore electrically connected to the conductive structure of the interconnection structure at a corresponding height in a lateral direction.

According to another aspect of the present disclosure, a method of manufacturing a semiconductor device is provided, including: stacking a plurality of element layers on a substrate, wherein each element layer includes a plurality of semiconductor elements in the element layer, each semiconductor element includes a gate electrode and source/drain regions on opposite sides of the gate electrode; forming an opening penetrating the plurality of element layers; forming an interconnection structure in the opening, wherein the interconnection structure includes an electrical isolation layer and a conductive structure in the electrical isolation layer, wherein the method further includes: controlling a height of the conductive structure of the interconnection structure, so that at least one of the gate electrode and the source/drain regions of each of at least a part of the semiconductor elements is in contact with and therefore electrically connected to the conductive structure of the interconnection structure at a corresponding height in a lateral direction.

According to another aspect of the present disclosure, an electronic apparatus is provided, including the above-mentioned semiconductor device.

According to the embodiments of the present disclosure, for a vertical stack of semiconductor elements, a sidewall interconnection structure adjoined thereto laterally may be provided. For a plurality of layers of elements, a mask layer may be used to reduce photolithography steps in the manufacturing process and reduce the manufacturing costs. In addition, a three-dimensional configuration provides interconnections among the elements with more space, and therefore they may be provided with low resistance and high bandwidth. Due to the presence of the sidewall interconnection structure, the semiconductor may have lead terminals, therefore, the manufacture of the semiconductor device and the manufacture of the metallization stack may be separated.

BRIEF DESCRIPTION OF THE DRAWINGS

Through description below of embodiments of the present disclosure with reference to the accompanying drawings, above-mentioned and other purposes, features and advantages of the present disclosure will become more apparent, wherein:

FIG. 1(A) to FIG. 25(C) schematically show some stages in a process of manufacturing a semiconductor device, particularly manufacturing an interconnection structure therein, according to the embodiments of the present disclosure; wherein FIGS. 1(A), 4(A) and 25(A) are top views, FIGS. 1(B), 2, 3(A), 4(B), 5 to 19, 20(A), 21, 22(A), 24(A), 25(B) are cross-sectional views along line AA', FIGS. 1(C), 1(D), 3(B), 4(C), 20(B), 22(B), 23, 24(B) and 25(C) are cross-sectional views along line BB'.

Throughout the drawings, the same or like reference numerals indicate the same or like components.

DETAILED DESCRIPTION OF EMBODIMENTS

Figure 1A:
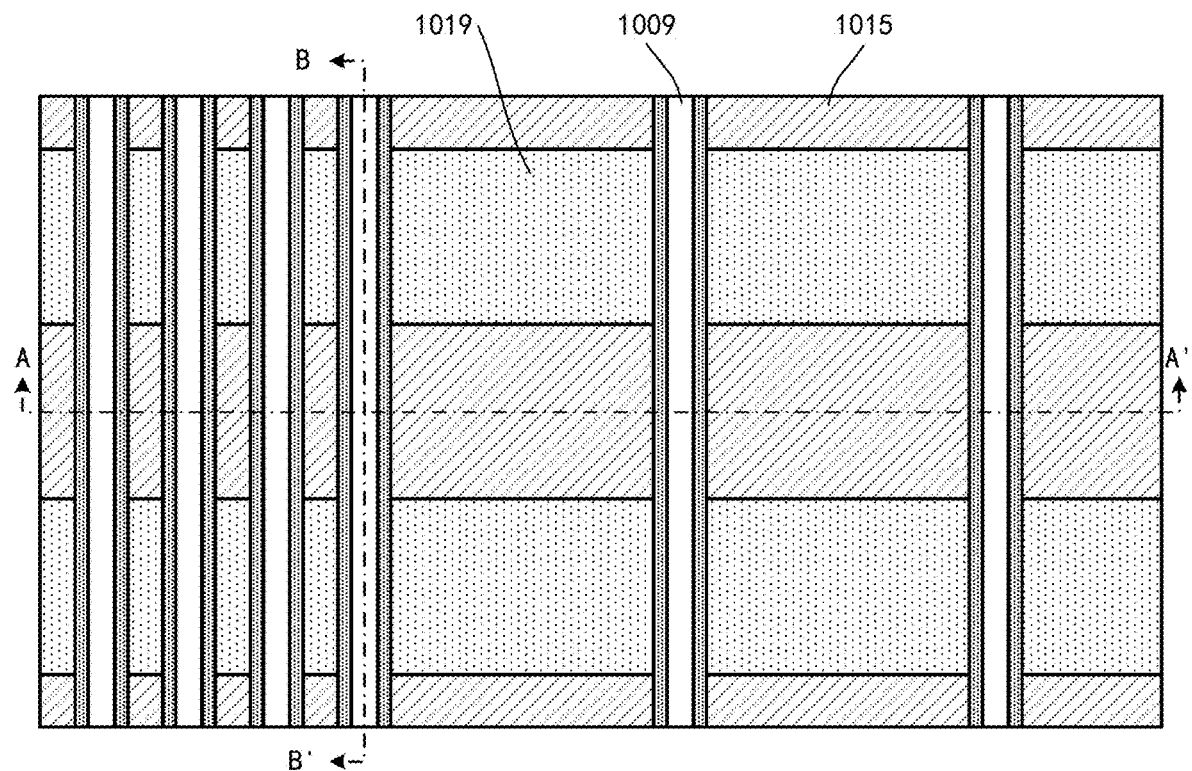

Hereinafter, the embodiments of the present disclosure will be described with reference to the accompanying drawings. However, it should be understood that these descriptions are only exemplary and are not intended to limit the scope of the present disclosure. In addition, in the following description, descriptions of well-known structures and technologies are omitted to avoid unnecessarily obscuring the concept of the present disclosure.

In the drawings, various structural schematic diagrams according to the embodiments of the present disclosure are shown. These drawings are not drawn to scale, some details are enlarged and some details may be omitted for clarity of presentation. Shapes of the various regions and layers, as well as the relative size and positional relationship between them which are shown in the drawings are only exemplary. In practice, there may be deviations due to manufacturing tolerances or technical limitations. Areas/layers with different shapes, sizes, and relative positions may be designed according to actual needs by those skilled in the art.

In the context of the present disclosure, when a layer/element is referred to as being "on" another layer/element, the layer/element may be directly on the another layer/element, or there may be an intermediate layer/element between them. In addition, if a layer/element is located "on"

another layer/element in an orientation, the layer/element may be located "under" the another layer/element when the orientation is reversed.

According to the embodiments of the present disclosure, a semiconductor device with a sidewall interconnection structure is provided. The so-called "sidewall" interconnection structure refers to this interconnection structure is formed in a lateral direction (for example, a direction substantially parallel to a surface of the substrate) of an element to be interconnected, and therefore may be interconnected with the element (for example, source/drain regions, gate electrode, etc. to be interconnected therein) through sidewalls of the element. Due to differences in height and/or orientation of the components to be interconnected, conductive structures interconnected thereto may be formed at sidewalls of the components, respectively.

For example, in a planar element such as a planar metal oxide semiconductor field effect transistor (MOSFET), a gate electrode is provided on an active region, so the gate electrode and the active region (especially source/drain regions therein) may be located at different heights (relative to a substrate on which the element is formed). Thus, the source/drain regions may be connected to a conductive structure (for example, an interconnection wire and/or a via hole) at a first height in the interconnection structure, and the gate electrode may be connected to a conductive structure at a second height larger than the first height in the interconnection structure. On the other hand, the source/drain regions may be located on opposite sides of the gate electrode (referred to as "a first side" and "a second side"). Thus, the source/drain regions may be connected to the corresponding conductive structure of the interconnection structure on the first side and/or the second side. Generally, on the first side and the second side of the element, sidewalls of the gate electrode are recessed inwardly with respect to sidewalls of the source/drain regions, so the gate electrode may be connected to corresponding conductive structures in the interconnection structure on a third side and/or a fourth side.

Similarly, in a vertical element, the source/drain regions and the gate electrode are stacked in the vertical direction, and therefore are located at different heights. Thus, through conductive structures at different heights in the interconnection structure, the interconnection to the vertical element is achieved.

A plurality of element layers may be stacked to form an element stack to increase an integration density. A plurality of element stacks may be provided on the substrate. The interconnection structures may be formed between the element stacks, so as to electrically connect elements to be interconnected within or between the element stacks with each other. More specifically, at a position where the interconnection structure adjoined the component that needs to be electrically connected, (a sidewall) of the conductive structure of the interconnection structure is exposed, and (a sidewall) of the component is also exposed, so that both of the sidewalls may be in contact with each other and therefore electrically connected with each other. There may be an observable interface between the interconnection structure and the element. In order to achieve the interconnection in various directions, the interconnection structure may surround each element stack. Of course, a part of the element stack may only be provided with an interconnection structure at a sidewall to be electrically connected.

To facilitate layout, the element stacks may be arranged in an extending direction of the gate electrode (referred to "a first direction") and in a second direction intersecting (for example, perpendicular to) the first direction, so as to form an array. Therefore, the interconnection structures may extend in the first direction and the second direction among the element stacks, and therefore may be adjoined the element stacks in the first direction and the second direction.

The interconnection structure may include an interconnection wire layer and a via hole layer provided in an electrical isolation layer (for example, a dielectric layer). The interconnection wire layer and the via hole layer may be arranged alternately. The interconnection wire layer may achieve the interconnection in a same layer, and the via hole layer may achieve the interconnection among different layers. The interconnection wire may include a body portion extending in a corresponding interconnection wire layer and a barrier layer surrounding the body portion.

Such semiconductor device may be manufactured as follows. For example, a plurality of element layers may be stacked on the substrate, and each element layer may include a plurality of semiconductor elements. For example, the elements in each element layer may be arranged in an extending direction of the gate electrode (that is the first direction) and the second direction intersecting the first direction, different layers may have the same or similar element layout. Based on such layout, the manufacture of the interconnection structures becomes more convenient.

An opening may be formed to penetrate each element layer, so that the elements (to be electrically connected) in each element layer are exposed at sidewalls of the opening. For example, the opening may be formed as a grid shape extending in the first direction and the second direction. In the opening, the interconnection structure may be formed so as to interconnect with the elements (to be electrically connected) exposed at the sidewalls of the opening.

The conductive structures of the interconnection structure may be formed in a plurality of layers to connect elements at different heights. For example, the interconnection wire may be formed in the opening (for example, on the substrate or a part of the formed interconnection structure). A dielectric material may be filled into the opening to bury the interconnection wire, and a via hole is formed in the filled dielectric material. By repeating such operation a plurality of times, the interconnection structure including a plurality of layers of interconnection wires and a plurality of layers of via holes is formed. The heights of the interconnection wire and the via hole are controlled by a height of the dielectric material.

The present disclosure may be provided in various manners, some examples of which will be described below. In the following description, a selection of various materials is involved. In addition to considering functions of the materials (for example, the semiconductor material is used to form the active region, the dielectric material is used to form the electrical isolation, and the conductive material is used to form the interconnection wire and the via hole), the selection of the material further considers an etching selectivity. In the following description, a required etching selectivity may or may not be indicated. It should be clear to those skilled in the art that when it is mentioned below that a certain material layer is etched, if it is not mentioned that other layers are also etched or the drawings do not show that other layers are also etched, this etching may be selective, and the material layer may have etching selectivity relative to other layers exposed to a same etching recipe.

FIGS. 1(A) to 25(C) schematically show some stages in a process for manufacturing a semiconductor device, particularly manufacturing an interconnection structure therein, according to the embodiments of the present disclosure.

Figure 1B:
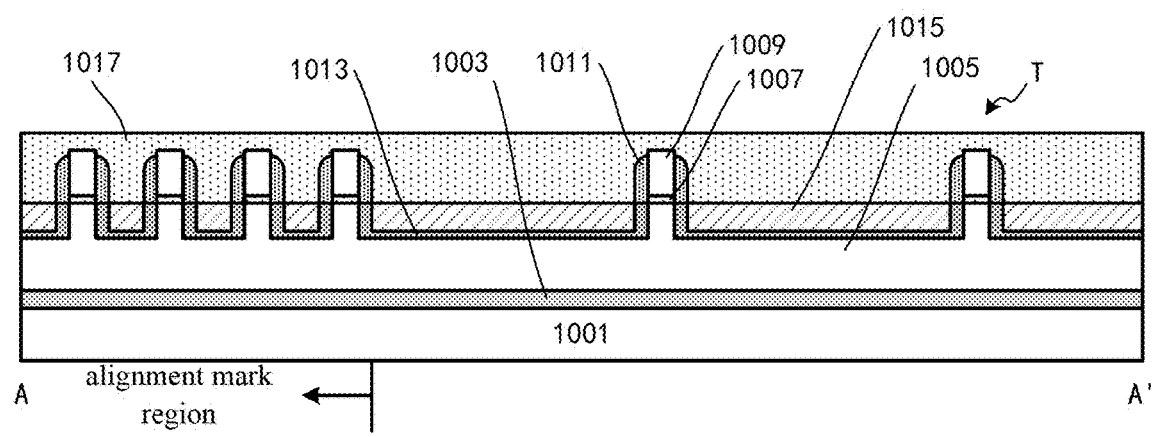
Figure 1C:
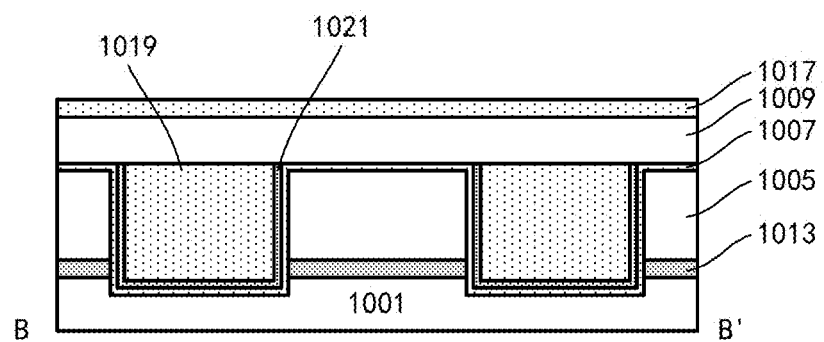

As shown in FIG. 1(A) to FIG. 1(C), a substrate 1001 is provided. The substrate 1001 may be a substrate in various forms, including but not limited to a bulk semiconductor material substrate such as a bulk Si substrate, a semiconductor-on-insulator (SOI) substrate, a compound semiconductor substrate such as a SiGe substrate, and the like. Hereinafter, the bulk Si substrate such as a silicon wafer is taken as an example for description.

The substrate 1001 may be doped to form a well region 1005, for example, a n-type well region may be formed for a p-type element, and a p-type well region may be formed for a n-type element, so as to facilitate forming semiconductor elements of different types, particularly in case of complementary metal oxide semiconductor (CMOS) process.

In the substrate 1001, an active region may be defined by an isolation portion 1019, such as shallow trench isolation (STI). For example, the isolation portion 1019 may be formed by etching a trench in the substrate 1001 and filling the trench with a dielectric material such as oxide (for example, silicon oxide). Before filling the oxide, a protective layer 1021 such as nitride (for example, silicon nitride) may be formed at sidewalls and a bottom of the trench, so as to protect the active region, and in particular the channel in subsequent processes.

A semiconductor element T, such as a metal oxide semiconductor field effect transistor (MOSFET), a fin field effect transistor (FinFET), a nanowire field effect transistor, etc. may be formed on the active region.

The semiconductor element T may include: a gate dielectric layer 1007 such as oxide and a gate electrode 1009 such as metal formed on the active region; and a source/drain region 1013 formed on both sides of the gate electrode 1009 in the active region. For example, the source/drain region 1013 may include a highly doped region in the active region. Gate spacers 1011 of, for example, nitride (for example, silicon nitride) may be formed at sidewalls of the gate dielectric layer 1007 and the gate electrode 1009. A metal silicide 1015 may be formed on the source/drain region 1013 to improve electrical contact performance. The metal silicide 1015 is used as a contact portion of the source/drain region 1013, therefore in the context of the element interconnection described in the present disclosure, it is considered as a part of the sour/drain region 1013. The semiconductor element T may be a planar element such as a planar MOSFET or a three-dimensional element such as a FinFET. In a case of FinFET, the active region may be formed in a form of a fin protruding with respect to a surface of the substrate.

A contact layer 1003 may be formed at the bottom of the semiconductor element T. Through the contact layer 1003, a bias may be applied to a body region of the semiconductor element T as needed. The contact layer 1003 may be a highly doped region in the substrate 1001 formed through, for example, ion implantation, and may have has the same doping type with the well region 1005 at the location of the contact layer 1003, however, a doping concentration of the contact layer 1003, which is for example, 1E18 to 1E21 cm$^{-3}$, is higher than that of the well region 1005.

Here, to facilitate layout, the gate electrode may extend in a first direction (for example, a vertical direction in FIG. 1(A)), and the active region may extend in a second direction (for example, a horizontal direction in FIG. 1(A)) intersecting (for example, perpendicular to) the first direction. At a position where the gate electrode and the active region overlap, the above-mentioned semiconductor element T may be formed, a dummy element (the structure is same as or similar to the semiconductor element T, but it does not work electrically) may also be formed. Here, only an isolation portion 1019 extending in the second direction is shown. The electrical isolation among the elements in the second direction may be achieved through isolation portions extending in the first direction, and may be achieved by dummy elements.

In addition, in the embodiment, an alignment mark region may be provided. The gate electrodes are formed in the alignment mark region, patterns of the gate electrodes may be used later as alignment marks. Shapes of the isolation portions and the gate electrodes in the alignment mark region may be changed according to lithographic requirements.

An interlayer dielectric layer 1017 such as oxide may be formed on the substrate 1001, to cover each semiconductor element T formed on the substrate 1001. It should be noted that, in the top view of FIG. 1(A), for clarity, the interlayer dielectric layer 1017 and the protective layer 1021 are not shown.

Figure 1D:
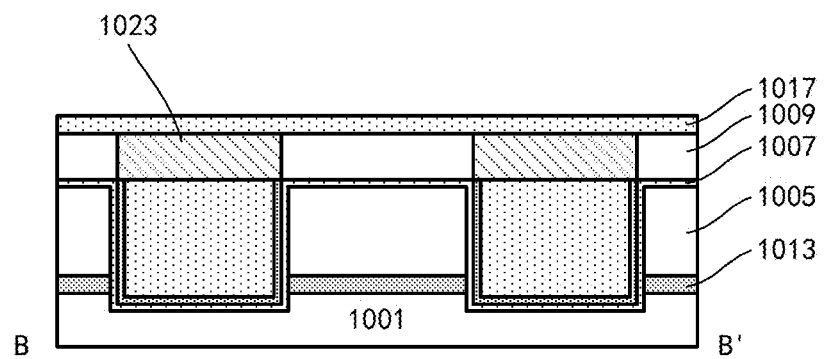

According to another embodiment of the present disclosure, as shown in FIG. 1(D), based on the layout design, in some areas, a part of the gate electrodes 1009 on the isolation portion 1019 may be replaced with other conductive materials 1023, such as metal silicide, or metal, or Cu, and the like. The other conductive materials 1023 may be remained in the subsequent process of manufacturing the sidewall interconnection structure (for example, due to etching selectivity), so that the gate electrodes 1009 at opposite ends may be kept electrically connected.

According to the embodiment, the arrangement shown in FIGS. 1(A) to 1(C) may be stacked in a plurality of layers to increase the integration density.

Figure 2:
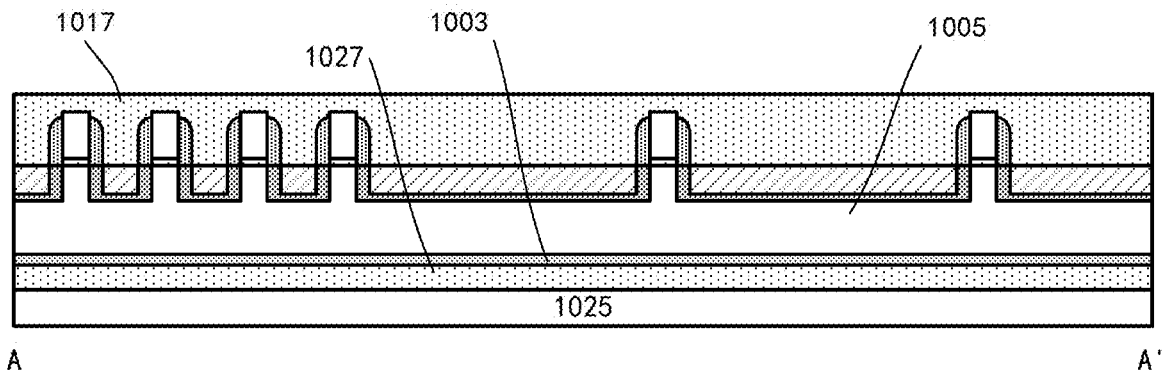

To this end, as shown in FIG. 2, the substrate 1001 may be ground/thinned from a back side of the substrate 1001 until the contact layer 1003 is exposed (a thickness of the contact layer 1003 may also be reduced). The structure thus obtained may be referred to as the element layer. Then, the element layer may be attached/mounted to a carrier wafer or the substrate 1025, for example by bonding. Between the element layer and the carrier wafer or substrate 1025, a dielectric layer 1027 such as oxide may be provided to achieve necessary electrical isolation.

Figure 3A:
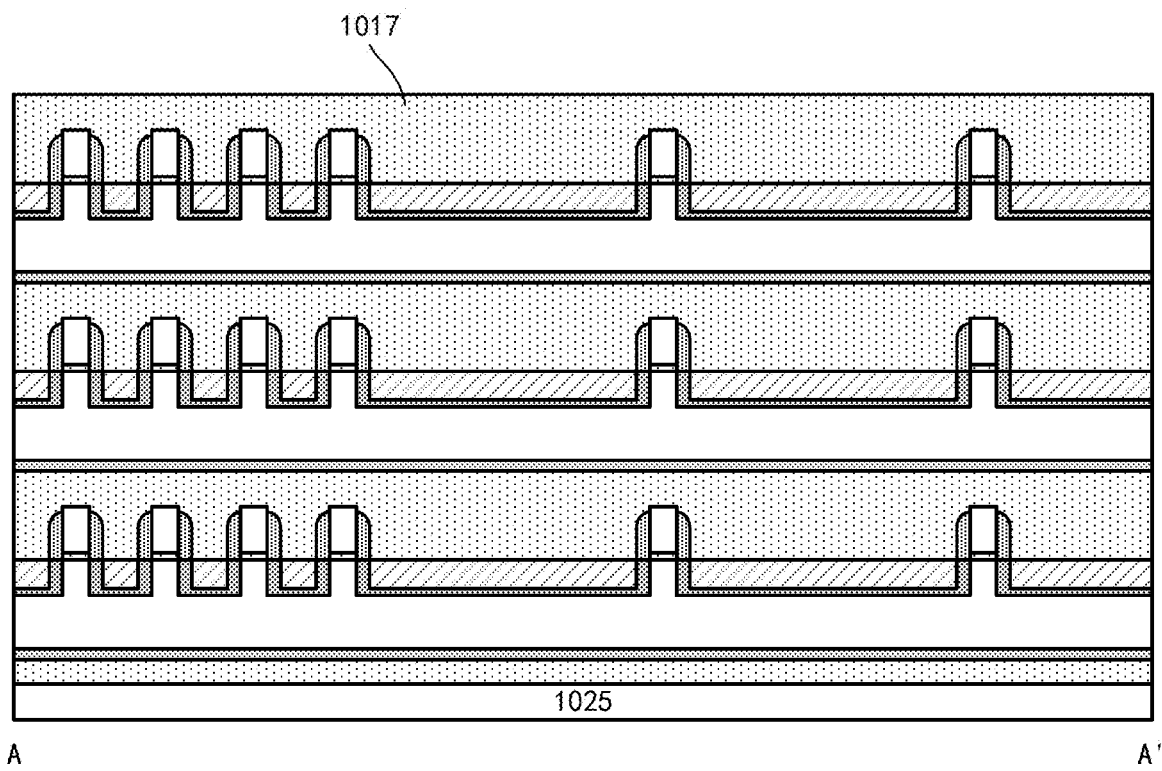
Figure 3B:
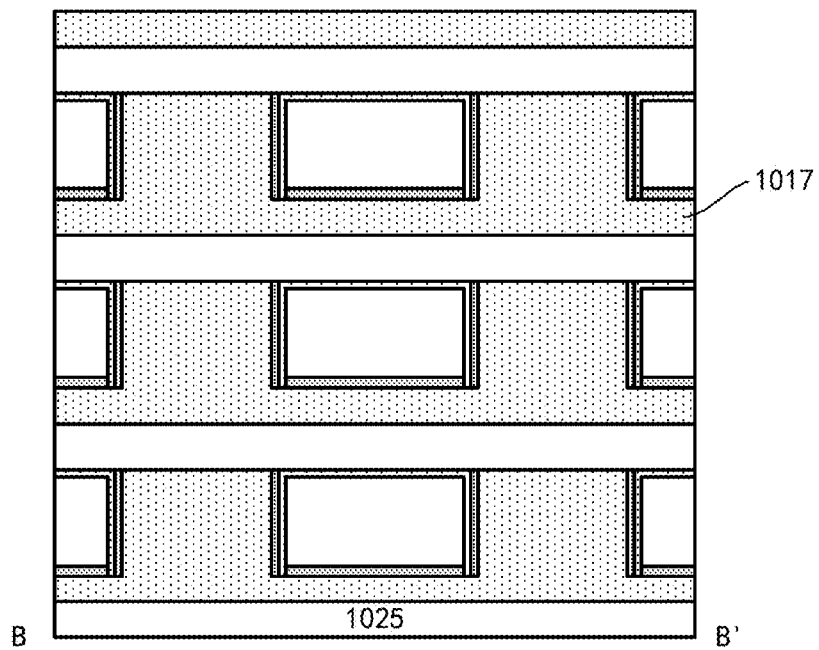

As shown in FIGS. 3(A) and 3(B), a plurality of such element layers may be sequentially stacked on the carrier wafer or substrate 1025. The elements formed in each element layer may be the same or different from each other, for example, different element types, and different electrical characteristics such as different threshold voltages, etc. Here, in order to facilitate subsequent formation of the sidewall interconnection structure, each element layer may have the same or similar layout. However, the present disclosure is not limited to this. For example, each element layer may also have a different layout.

Here, for convenience, the interlayer dielectric layers in the stack obtained after stacking each element layer are all marked as 1017.

Next, the area used to form the sidewall interconnection structure may be defined.

Figure 4A:
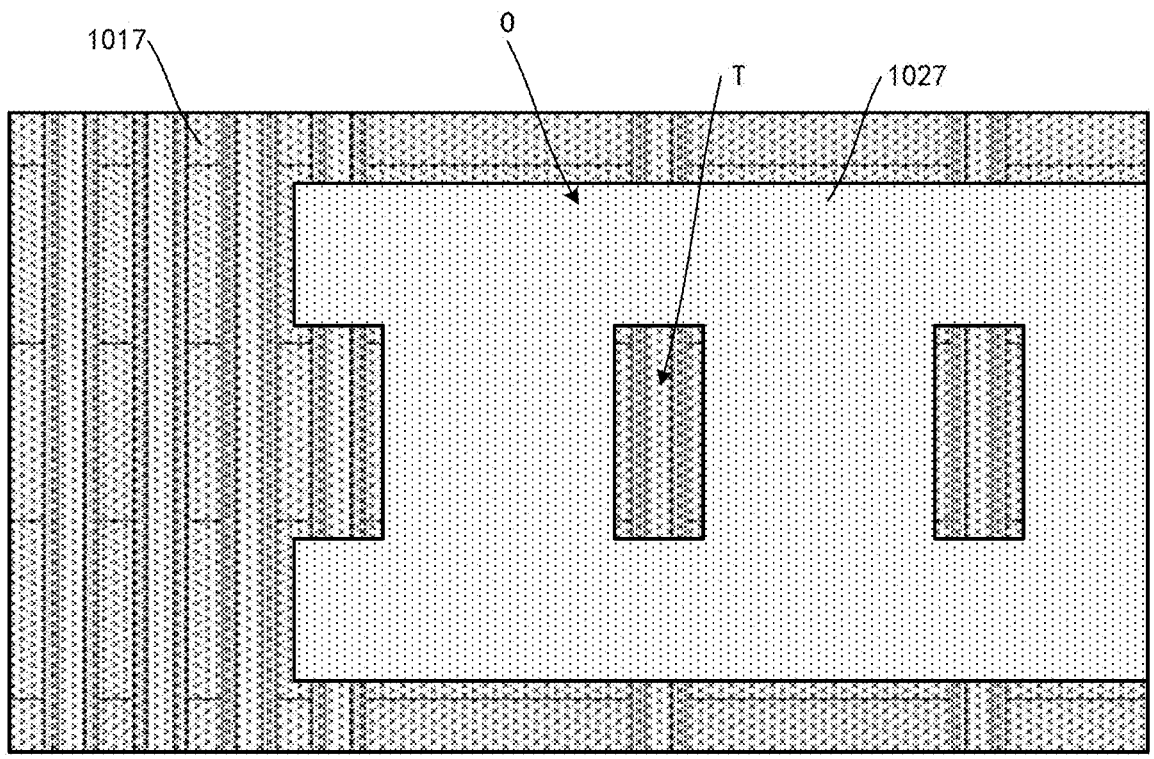
Figure 4B:
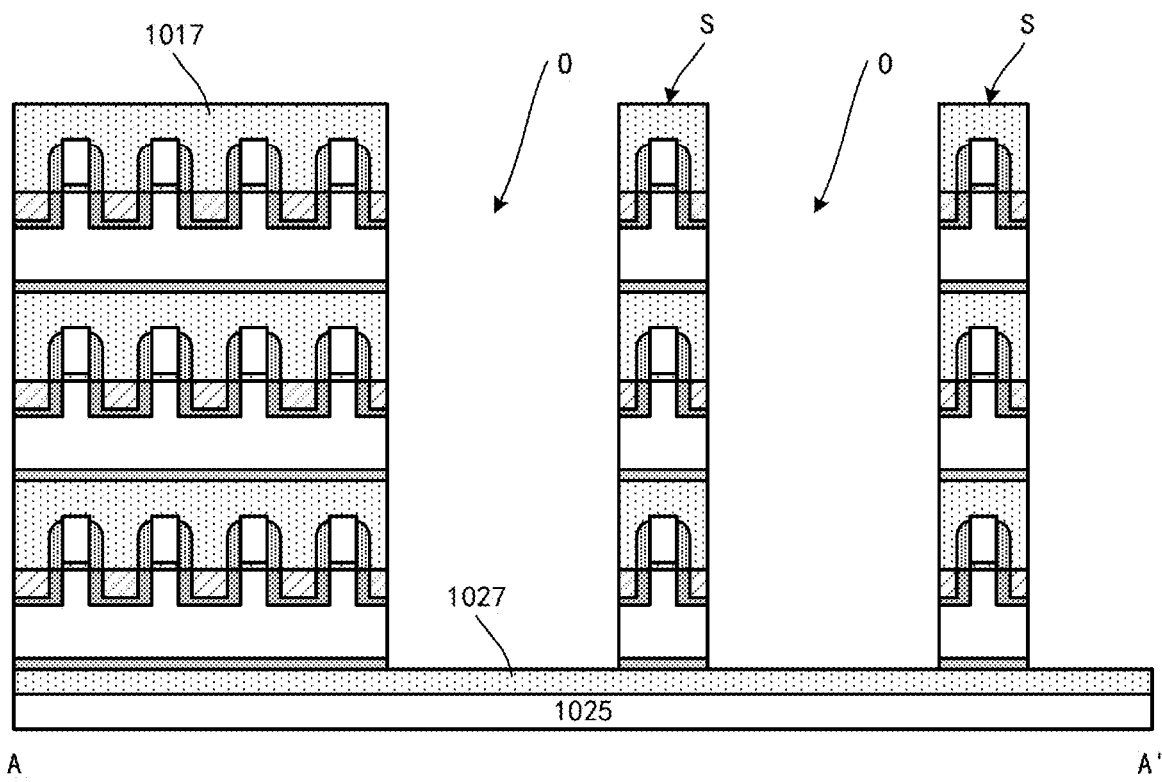
Figure 4C:
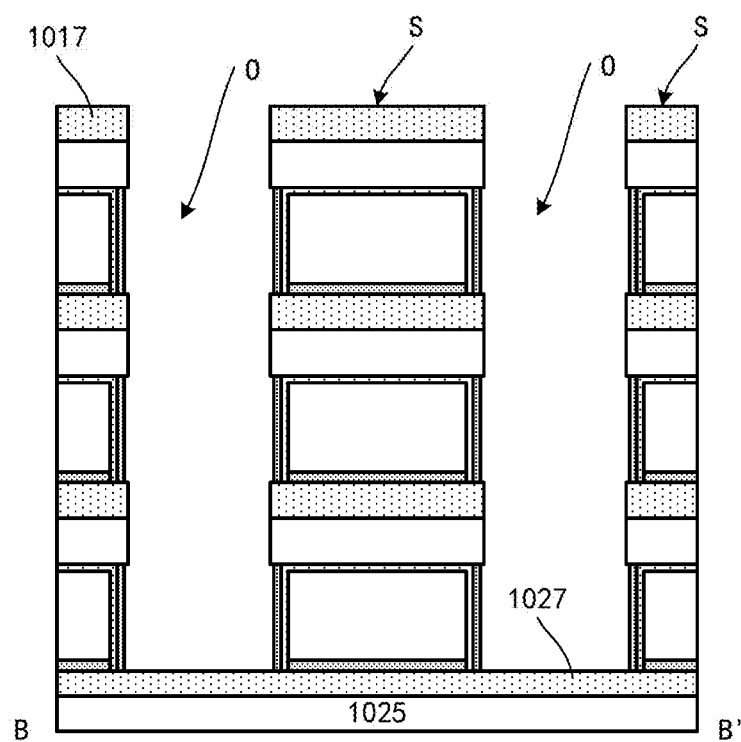

For example, as shown in FIG. 4(A) to 4(C), the trench O may be formed in the stack by forming a photoresist and performing anisotropic etching such as reactive ion etching (RIE). The trench O may penetrate each element layer (especially the area between the elements in each element layer), so that the components in each element layer that need to be electrically connected, such as the gate electrode, the source/drain region (especially a silicide layer formed on the source/drain region), the contact layer, etc. may be exposed at the sidewalls of the trench O. Here, it is shown that the trench O has the dielectric layer 1027 as the bottom. As shown in FIG. 4(C), the protective layer 1021 may prevent the etching of the interlayer dielectric layer 1017 from affecting the channel and a p-n junction between the channel and the source/drain region.

In the top view of FIG. 4(A), for clarity, the portion of the dielectric layer 1027 exposed by the trench O and the interlayer dielectric layer 1017 that are of the same oxide are shown in different gray scales. As shown in FIG. 4(A), the formed trench O may surround each semiconductor element T. In addition, the trench O may also extend to the alignment mark region.

As shown in FIGS. 4(B) and 4(C), due to the trench O, a plurality of element stacks S are formed on the carrier wafer or substrate 1025, and each element stack S includes a plurality of layers of elements stacked in the vertical direction (for example, the direction perpendicular to a surface of the carrier wafer or substrate 1025). In this example, each layer in each element stack S includes only a single element T. However, the present disclosure is not limited to this. For example, one or more of the element stacks S may include two or more elements T. The trench O is formed between the element stacks S, and then an interconnection structure may be formed in the trench O to interconnect the elements in the element stack S with each other. Here, since the interconnection structure adjoins the element in the lateral direction and is in contact with the sidewalls of the components to be electrically connected in the element, it may be called a sidewall interconnection structure.

In the alignment mark region, the alignment marks of each element layer are currently stacked on each other, so that only the alignment marks of the uppermost element layers are exposed. The alignment mark region may be patterned so that the alignment mark of each element layer may be exposed, so that the alignment mark may be provided for each element layer later.

Figure 5:
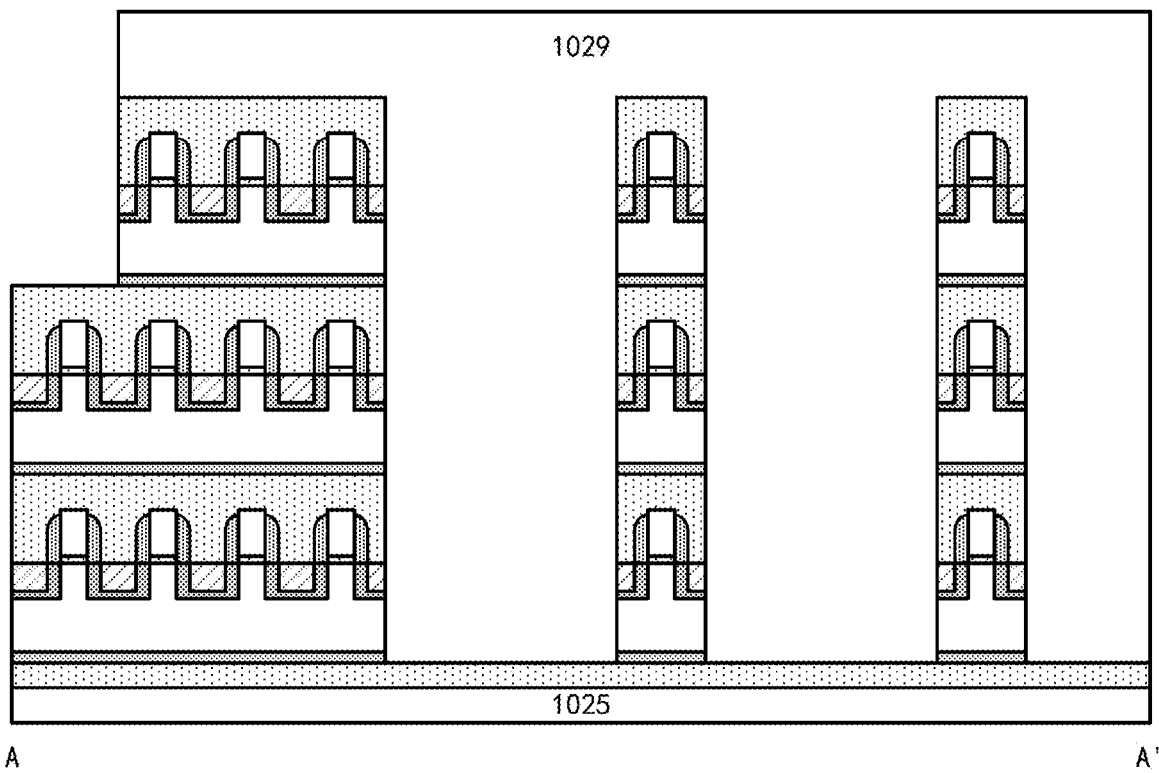

To this end, as shown in FIG. 5, a photoresist 1029 may be formed on the carrier wafer or substrate 1025, and it is patterned to expose a part of the alignment mark region of the uppermost element layer (in this example, a leftmost gate electrode used as the alignment mark is exposed). Using the photoresist 1029 as a mask, each layer in the alignment mark region of the uppermost element layer (also referred to as a first element layer) is selectively etched, such as reactive ion etching (RIE), so as to expose the alignment mark region of a second-uppermost element layer (also referred to as a first element layer) (specifically, the leftmost gate electrode used as the alignment mark is exposed).

Figure 6:
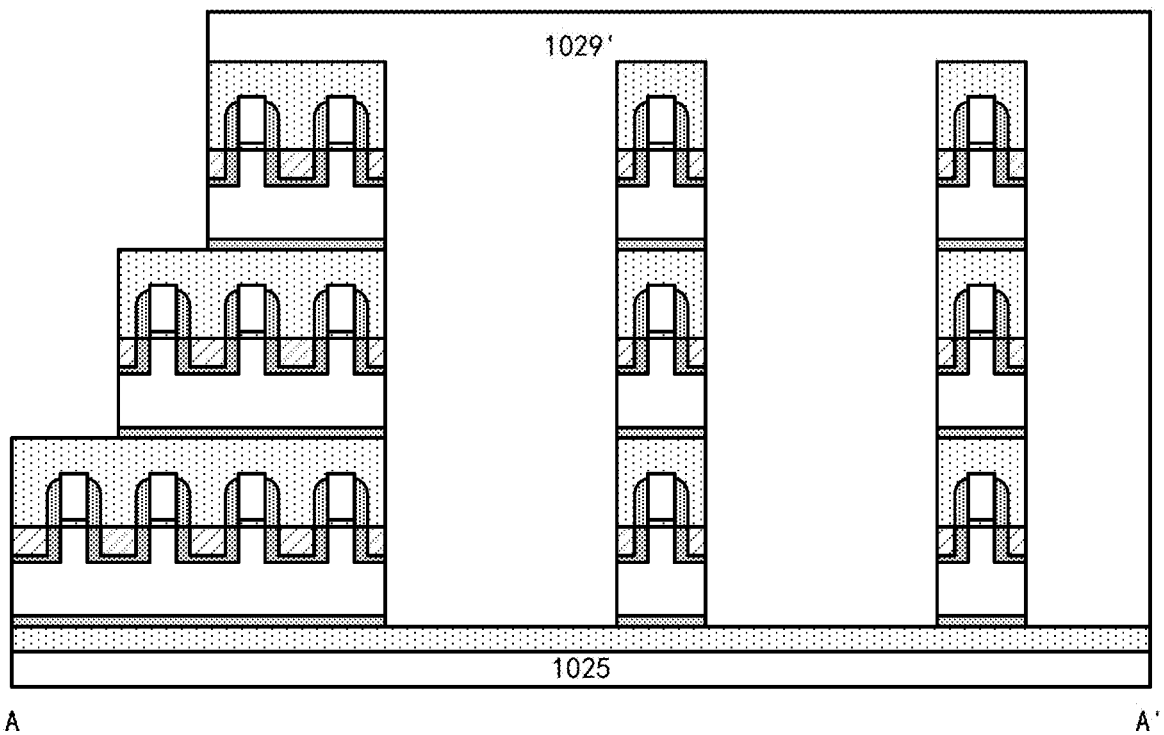

Then, as shown in FIG. 6, the photoresist 1029 may be trimmed (the trimmed photoresist is shown as 1029') to expose more alignment mark regions (in this example, the leftmost two gate electrodes used as the alignment marks are exposed). Using the photoresist 1029' as a mask, each layer in the alignment mark region of the first element layer and the second element layer are selectively etched, such as RIE, to expose the alignment mark region of a lowermost element layer (also referred to as a third element layer) (specifically, the leftmost gate electrode used as the alignment mark is exposed).

Figure 7:
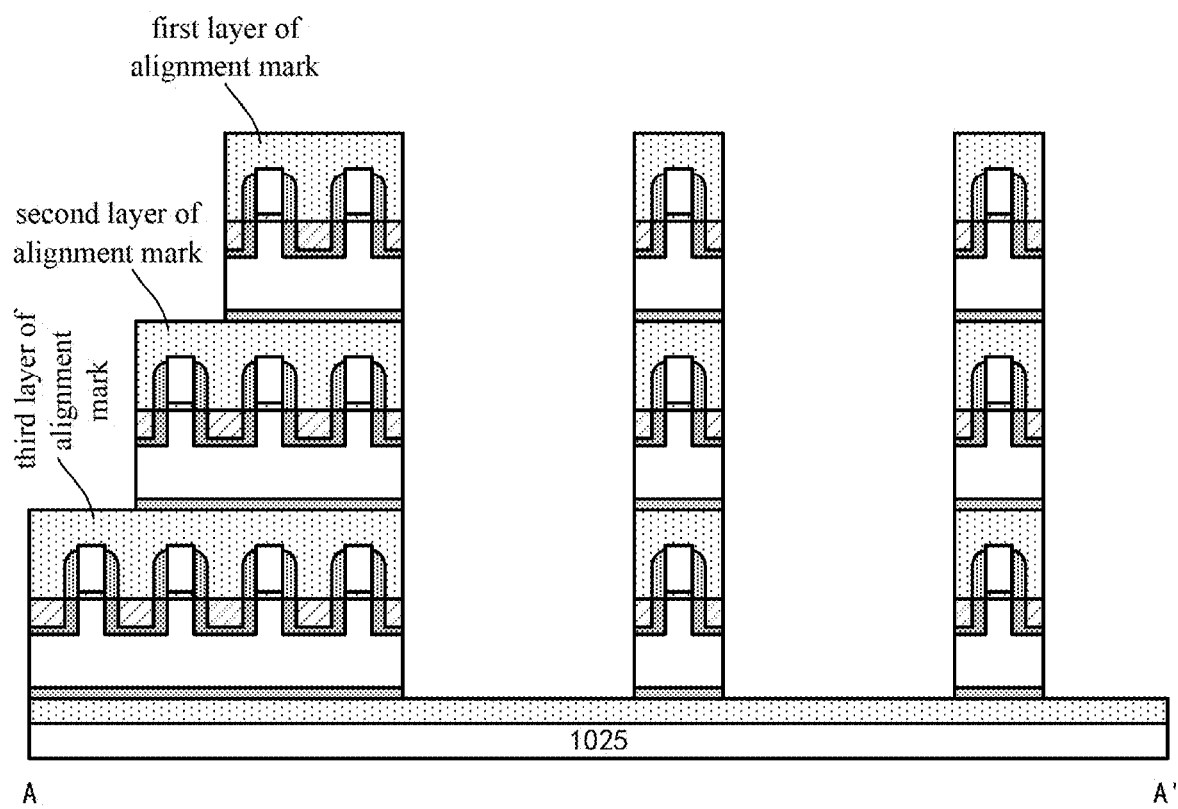

As shown in FIG. 7, the photoresist 1029' may be removed. The alignment mark regions have a step structure, so the alignment mark of each layer may be exposed in sequence. Through the alignment mark of each layer, a relative position of the elements in the corresponding layer may be known, and therefore, the subsequently formed conductive structure for the corresponding layer may be better aligned and connected with the elements in the layer. In addition, an oxidation treatment may be performed to oxidize a surface of the semiconductor (for example, Si) exposed in the trench O, and then the oxide is removed to repair possible damage caused by etching during forming the trench O.

In the trench O, the interconnection structure may be formed to electrically connect different elements in the same layer and/or elements in different layers with each other. The interconnection structure may include various conductive structures, such as interconnection wires, via holes, and the like.

When forming the interconnection wires, in order to avoid difficulties of etching trenches and then filling the trenches with a conductive material such as metal in a conventional process, according to the embodiments of the present disclosure, the conductive structure may be formed first, and then the dielectric material may be filled.

For the current element stack S, the lowermost is the contact layer 1003. A conductive structure for the contact layer 1003 may be formed first.

Figure 8:
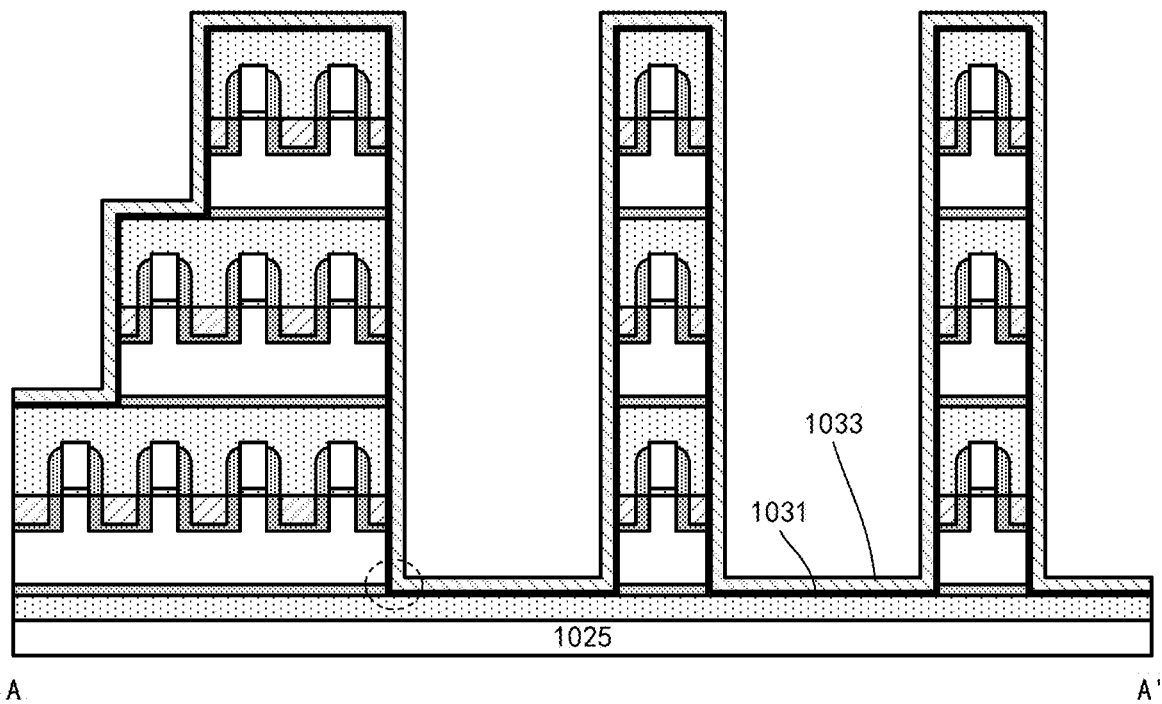

For example, as shown in FIG. 8, a conductive barrier layer 1031 and a conductive body layer 1033 may be formed in sequence in a substantially conformal manner by deposition. The conductive barrier layer 1031 may prevent the conductive body layer 1033 from diffusing to the surroundings, for example, the conductive barrier layer may include conductive nitrides such as TiN, TaN, and the like. The conductive body layer 1033 may be used to achieve electrical connections between elements, and may include, for example, metals such as tungsten (W), cobalt (Co), rubidium (Ru), copper (Cu), aluminum (Al), nickel (Ni), etc. As shown by the dashed box in FIG. 8, the formed conductive barrier layer 1031 and the conductive body layer 1033 may be in contact with and connected to the contact layer 1003 of the lowermost element in each element stack S at corners.

Then, the conductive barrier layer 1031 and the conductive body layer 1033 may be patterned into a conductive structure for the contact layer 1003 of the lowermost element in each element stack S. In this example, a part of the conductive barrier layer 1031 and the conductive body layer 1033 at the bottom of the trench O is retained, so that a mask covering this part may be formed.

Figure 9:
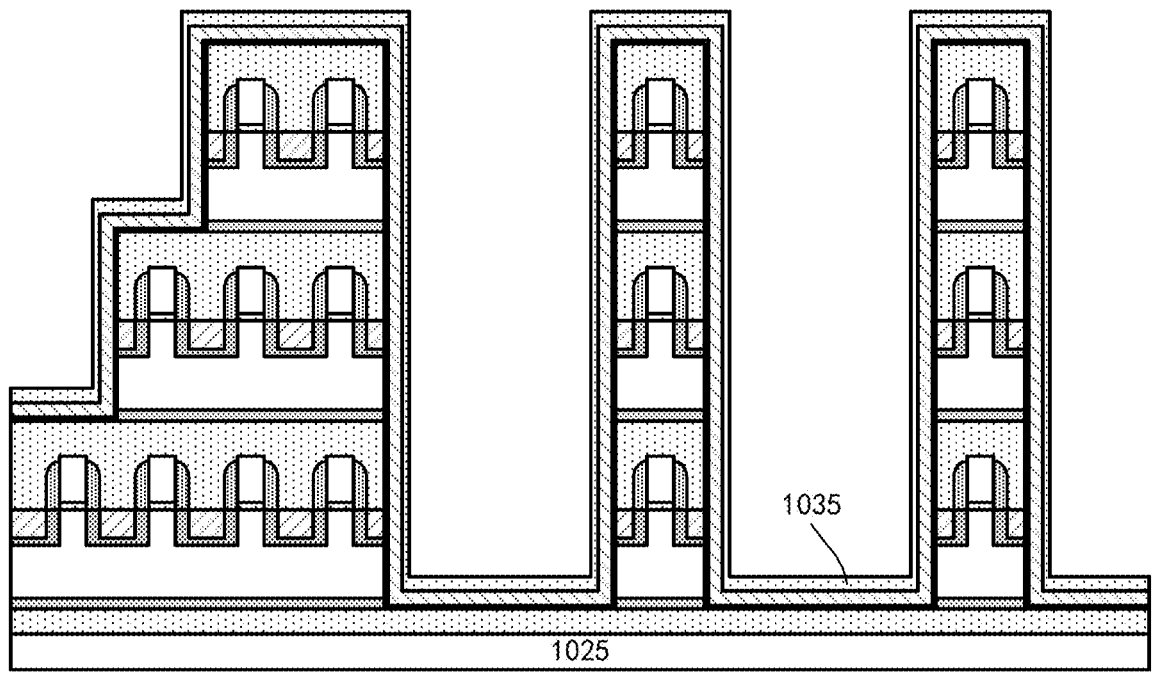

For example, as shown in FIG. 9, the mask layer 1035 may be formed by deposition. To form the mask as described above, the mask layer 1035 may be formed to have a thick lateral extension part and a thin vertical extension part. For example, this may be achieved by high-density plasma (HDP) deposition. Here, a thickness of the thick part of the mask layer 1035 may be about 20-150 nm.

Figure 10:
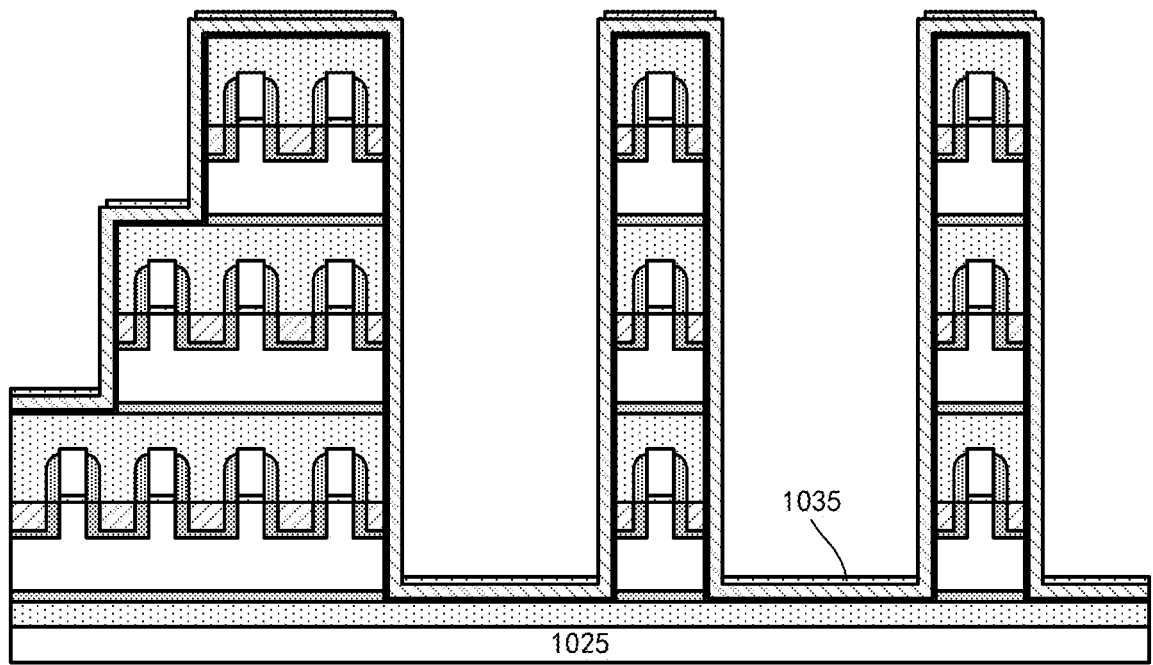

Then, as shown in FIG. 10, the mask layer 1035 may be etched isotropically, and a thickness of the etching may remove the vertical extension part of the mask layer 1035, but remain the lateral extension portion. For example, the thickness of the retained part may be about 15-100 nm. Thus, the conductive barrier layer 1031 and the conductive body layer 1033 at the bottom of the trench O may be covered by the mask layer 1035.

Figure 11:
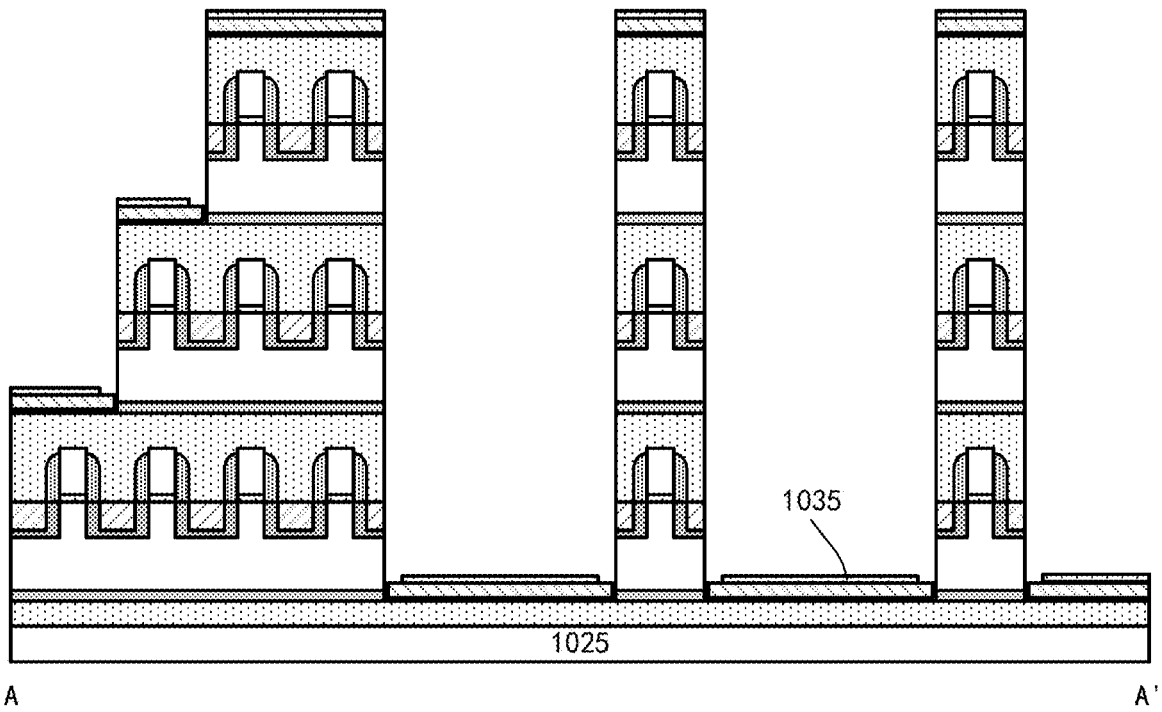

Next, as shown in FIG. 11, the mask layer 1035 may be used as a mask to perform isotropic etching on the conductive barrier layer 1031 and the conductive body layer 1033, so that they may be retained at the bottom of the trench O (a part of which is retained on a top surface of each stack and alignment mark region, which will be removed in subsequent processes). Here, atomic layer etching (ALE) may be used to achieve good etching control. After that, the mask layer 1035 may be removed.

Figure 12:
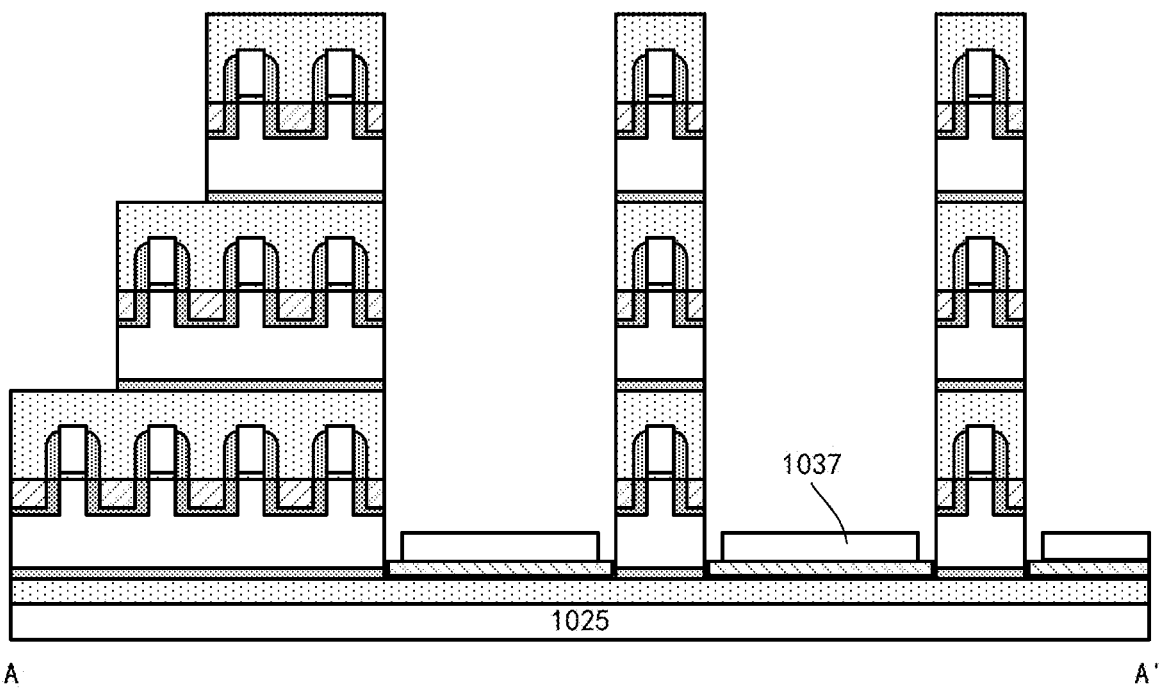

The method of forming the mask is not limited to the above method. For example, as shown in FIG. 12, instead of forming the mask layer 1035, a photoresist may be formed on the structure shown in FIG. 8, for example, by spin coating. The photoresist may be exposed. A depth of light entering the photoresist may be controlled so that only an upper part of the photoresist is exposed. The exposed upper part of the photoresist may be removed by development. Thus, the photoresist of a certain thickness 1037 may be retained at the bottom of the trench O. The photoresist 1037 may be used as a mask to perform isotropic etching on the conductive barrier layer 1031 and the conductive body layer 1033, so that they are retained at the bottom of the trench O. After that, the photoresist 1037 may be removed.

In the following, for convenience, the structure shown in FIG. 11 is still taken as the example for description.

Figure 13:
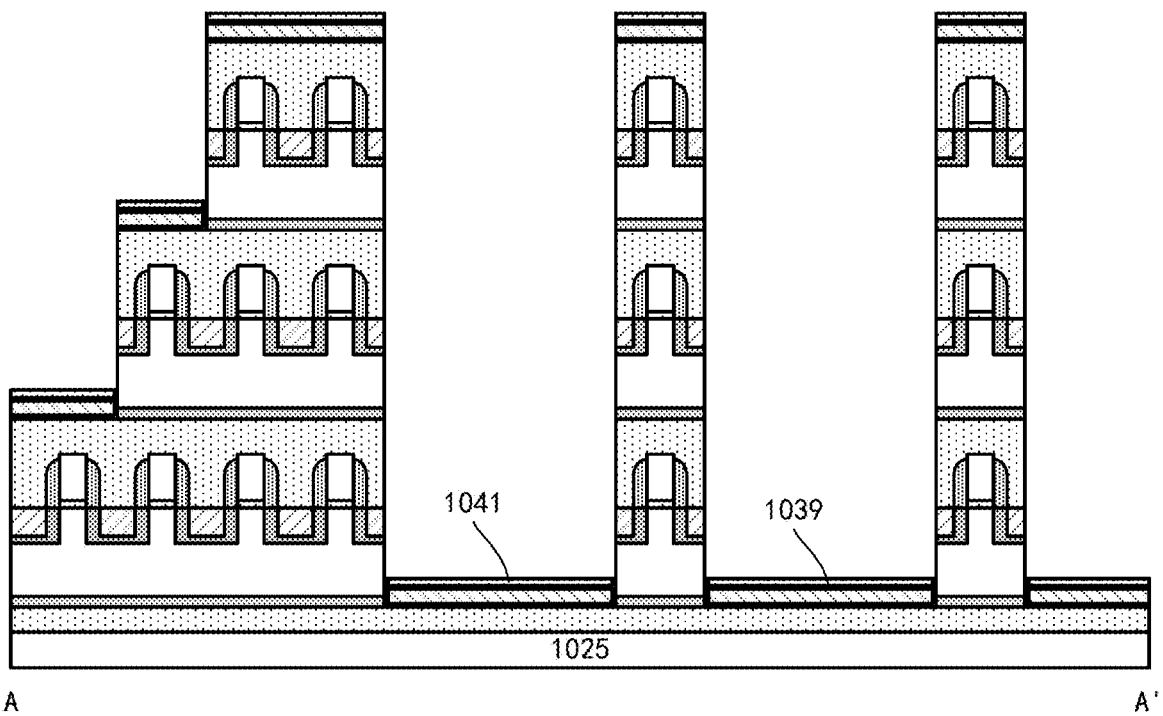

A top surface of the conductive body layer 1033 is exposed to the outside. In order to prevent the conductive body layer 1033 from diffusing, a barrier layer may be formed on the top surface of the conductive body layer. For example, as shown in FIG. 13, a conductive barrier layer 1039 may be formed in a substantially conformal manner by deposition. The conductive barrier layer 1039 and the conductive barrier layer 1031 may include a same material or different materials. Then, the method described above in conjunction with FIGS. 9 to 11 may be used to form a mask layer 1041 such as oxide, and as shown in FIG. 10, the conductive barrier layer 1039 may be etched in an isotropic manner by using the mask layer 1041 so that the conductive barrier layer 1039 may be retained at the bottom of the trench O (a part of which is retained on the top surface of each stack and alignment mark region, which will be removed in subsequent processes).

Figure 14:
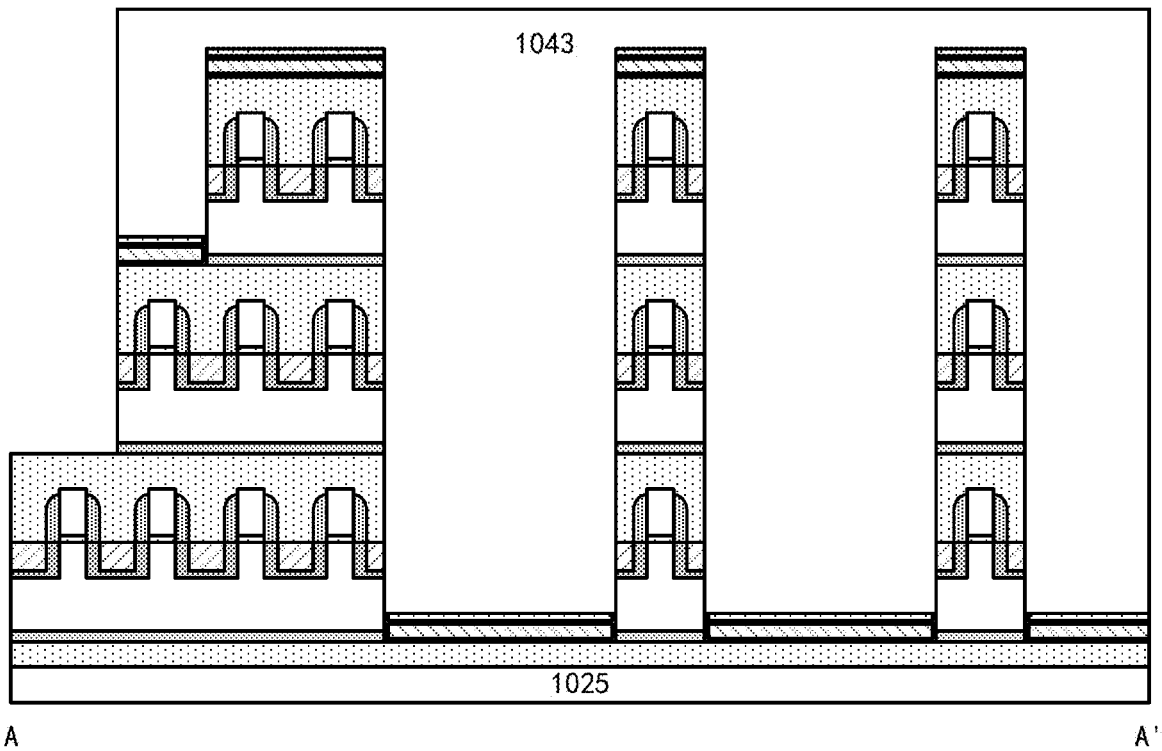

Next, the conductive body layer 1033 covered by the conductive barrier layers 1031, 1039 may be patterned. The alignment mark in the corresponding element layer may be referenced to facilitate pattern positioning. To this end, the lowermost (here, the third layer) alignment mark may be exposed. For example, as shown in FIG. 14, a photoresist 1043 may be formed, and it is patterned to at least partially expose a step where the third layer of alignment marks locates. Then, the photoresist 1043 is used as a mask to perform selective etching such as RIE on the material that is remained on the step where the third layer of alignment marks are located in the previous process, so that the remained material is removed, so as to at least partially expose the third layer of alignment marks. After that, the photoresist 1043 may be removed.

Figure 15:
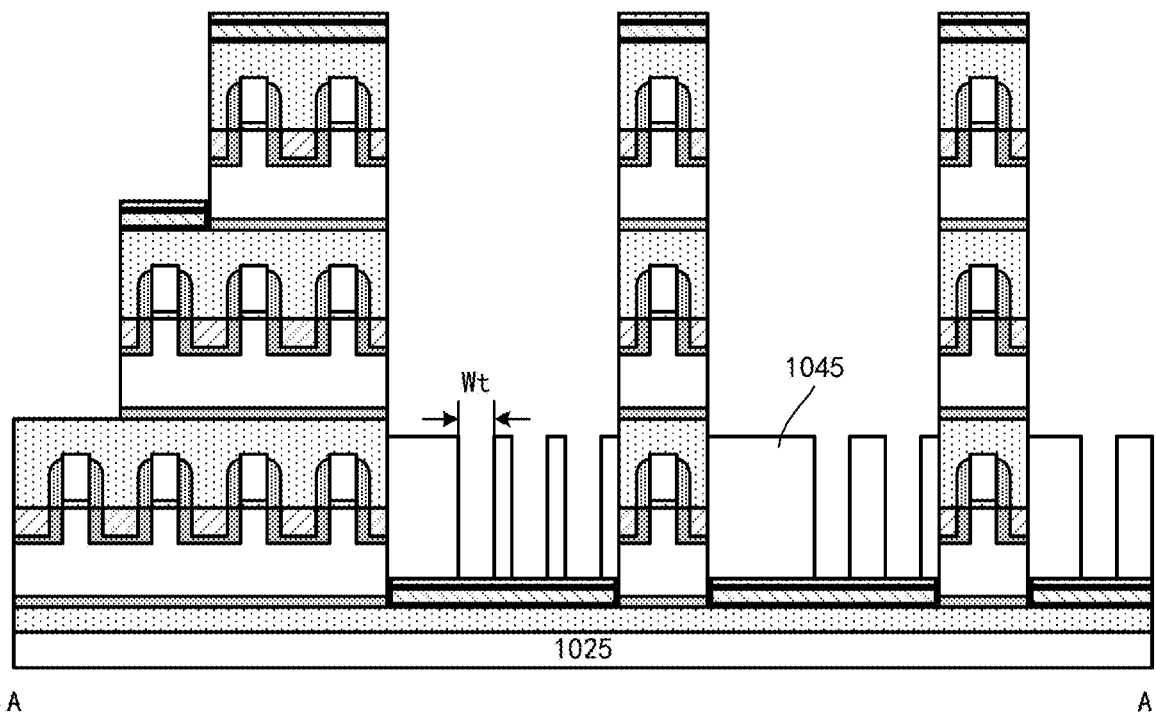

Next, as shown in FIG. 15, a mask layer 1045 for patterning the conductive structure may be formed in the trench O. For example, a photoresist may be spin-coated and etched back so that a top surface of the photoresist may expose the third layer of alignment marks, and then the photoresist may be patterned in assistance of the third layer of alignment marks (for example, lithography or electron beam exposure, etc.) to form the mask layer 1045. A minimum gap Wt of openings in the mask layer 1045 may be kept substantially uniform, which facilitates consistency of subsequent processes. To ensure this consistency, a part of the conductive structures defined by the patterned photoresist may be a dummy conductive structure.

Figure 16:
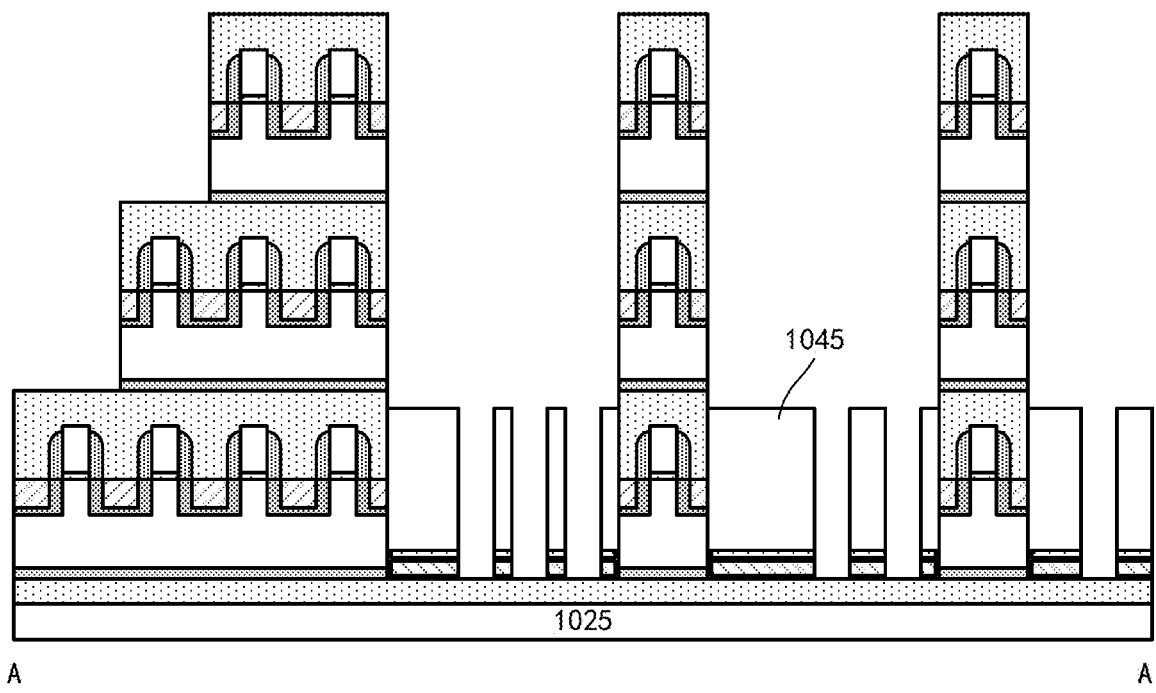

Next, as shown in FIG. 16, the mask layer 1045 may be used as an etching mask, and the mask layer 1041, the conductive barrier layer 1039, the conductive body layer 1033 and the conductive barrier layer 1031 may be selectively etched, such as RIE, in sequence. The etching may be stopped at the dielectric layer 1027 (or may enter the dielectric layer 1027 slightly to ensure that each conductive layer is cut off). In this way, a laterally extending conductive structure is formed at the bottom of the trench O at a height corresponding to the contact layer 1003, and at least a part of the conductive structure is in contact with and therefore electrically connected with the lowermost contact layer 1003 of each element stack S. In addition, due to the etching step, residues on the top surface of each element stack and alignment mark region may be removed. After that, the mask layer 1045 may be removed.

Figure 17:
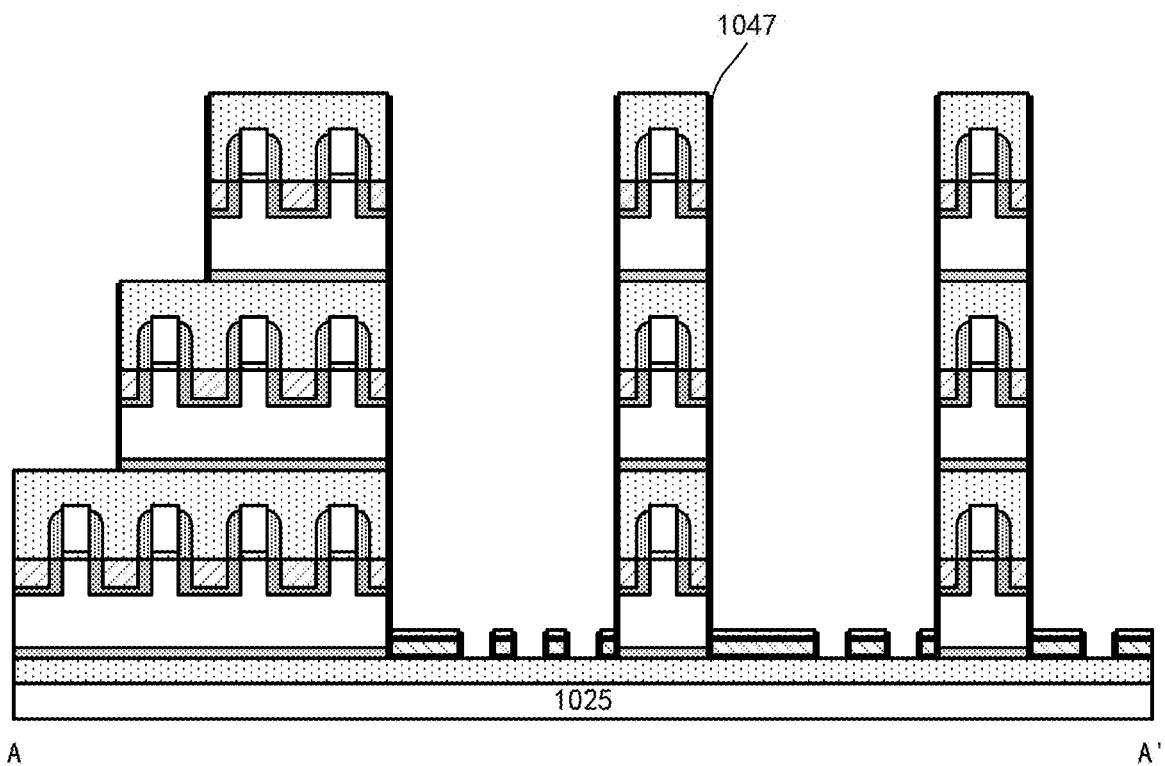

Due to this etching, a part of sidewalls of the conductive body layer 1033 is exposed to the outside. In order to prevent the conductive body layer 1033 from diffusing, a conductive barrier layer may be formed at the sidewalls of the conductive body layer 1033. For example, as shown in FIG. 17, a conductive barrier layer 1047 may be formed in a substantially conformal manner by deposition, and a laterally extending portion of the conductive barrier layer is removed and a vertically extending portion of the conductive barrier layer is retained by anisotropic etching such as RIE. Thus, the conductive barrier layer is formed in a form of spacer and retained at the sidewalls of the conductive body layer 1033. The conductive barrier layer 1047 may include a same material or different materials as the conductive barrier layers 1031, 1039. In order to maintain consistency, the conductive barrier layers 1031, 1039, and 1047 may have the same material and substantially the same film thickness.

Figure 18:
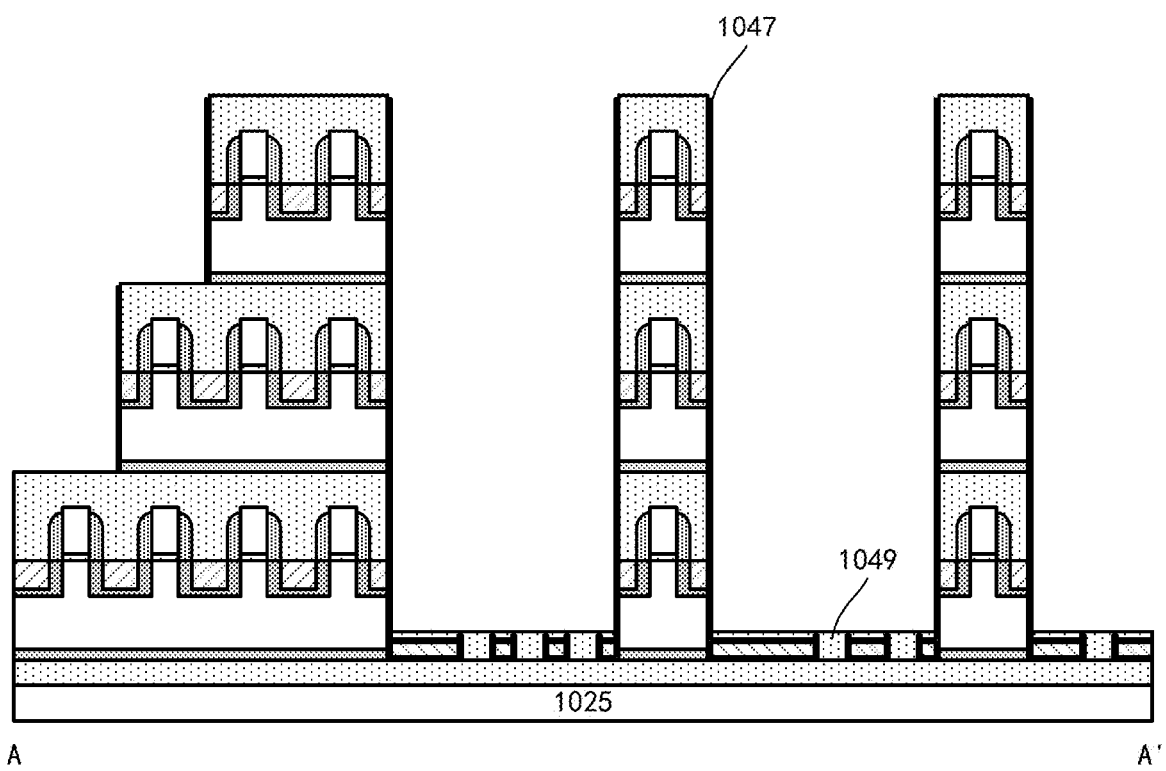

The conductive barrier layer 1047 in the form of spacer only needs to cover the conductive body layer 1033. To this end, as shown in FIG. 18, a dielectric layer 1049 (for example, oxide) may be filled in the trench O, and particularly between the gaps of the conductive structure. The dielectric layer 1049 may be formed by deposition and then etched back. A thickness of the deposited dielectric layer 1049 may be greater than Wt/2, so that a gap between the conductive structures may be completely filled. Here, for convenience only, the filled dielectric layer 1049 and the mask layer 1041 that may still retain are shown as a whole, which is labeled as 1049.

Since the dielectric layer 1049 is located inside the trench O, it is difficult to be planarized by a process such as chemical mechanical polishing (CMP). In order to ensure that the top surface of the dielectric layer 1049 has a certain flatness to facilitate subsequent photolithography, the conductive structure may include some dummy patterns (that is, interconnection wires and/or via holes that do not achieve a real electrical connection) so that the minimum gap may be kept substantially the same as described above. In addition, a thickness of the deposited film may be greater than half of the minimum gap. In order to better control a flatness of the dielectric layer 1049, atomic layer deposition (ALD) may be used for its deposition, and ALE may be used for its etch-back.

Figure 19:
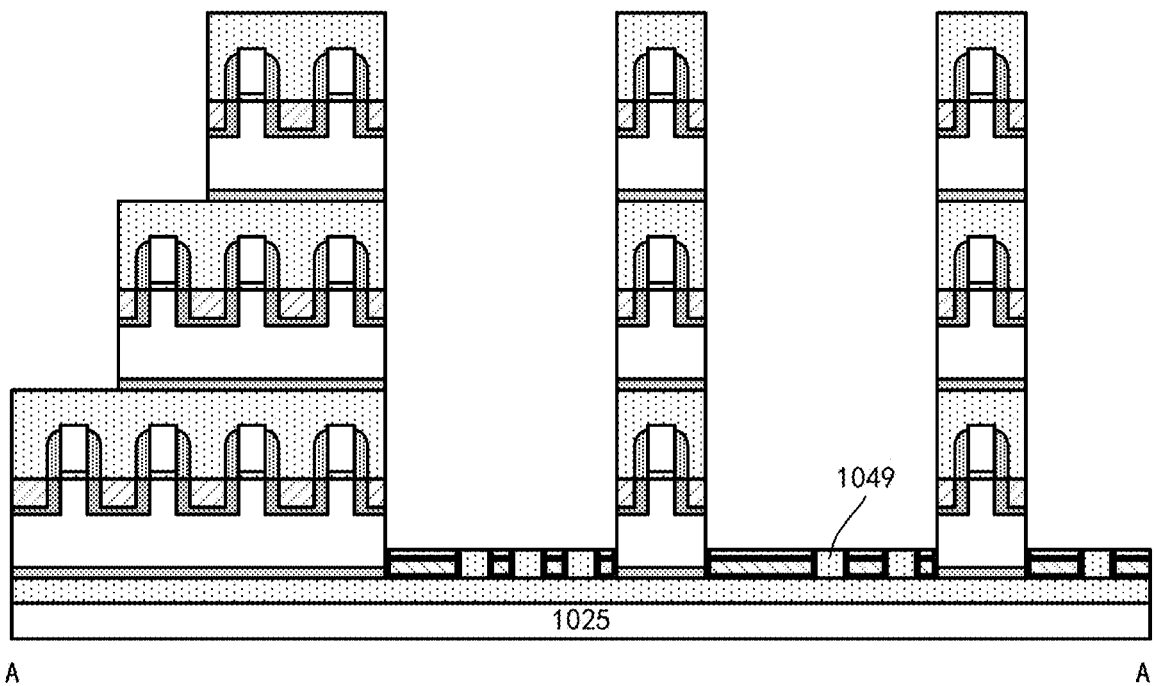

Then, as shown in FIG. 19, a part of the conductive barrier layer 1047 exposed by the dielectric layer 1049 may be removed by selective etching such as RIE. In this way, the conductive body layer 1033 is encapsulated by the conductive barrier layers 1031, 1039, and 1047. There is an interface or boundary between the conductive structure formed as such and the element stack (such as the components to be connected, for example, the source/drain region, the gate electrode, and the like) due to factors such as different materials, misalignments in an up-down direction or front-rear direction. In addition, there may also be an interface or boundary between the dielectric layer 1049 and the element stack (for example, the interlayer dielectric layer therein).

A conductive structure layer is formed above. A plurality of layers of conductive structure may be formed one by one in a same or similar manner.

Next, for example, conductive structures for the source/drain layer of the lowermost element of each element stack may be formed.

Figure 20A:
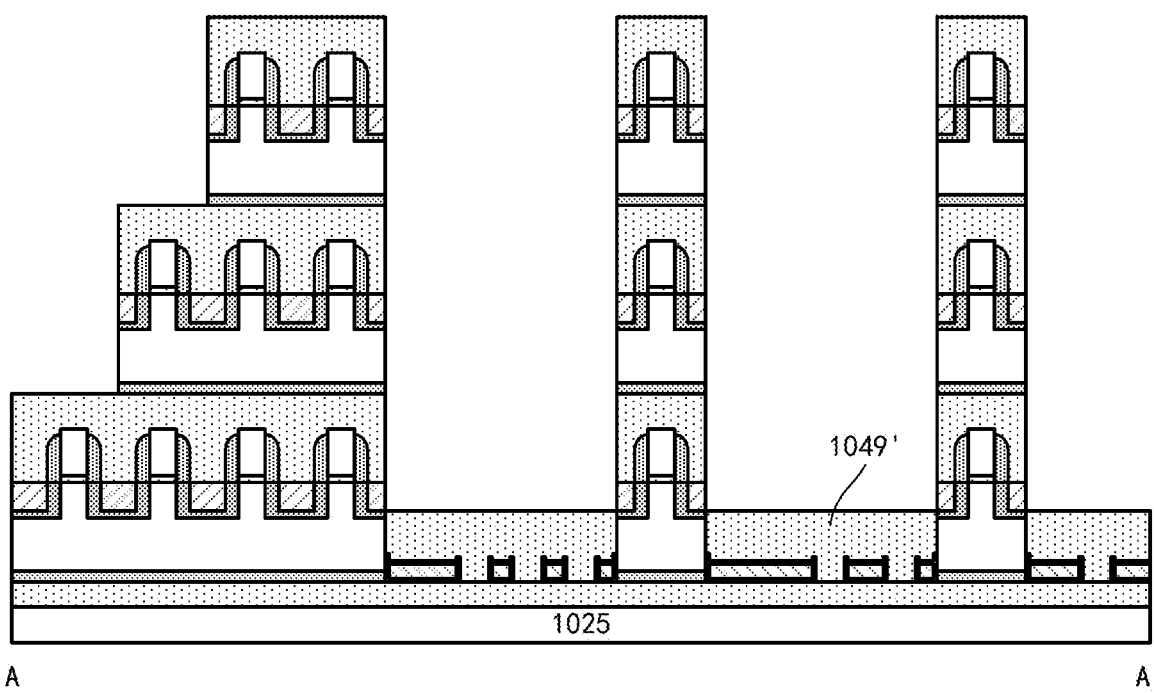
Figure 20B:
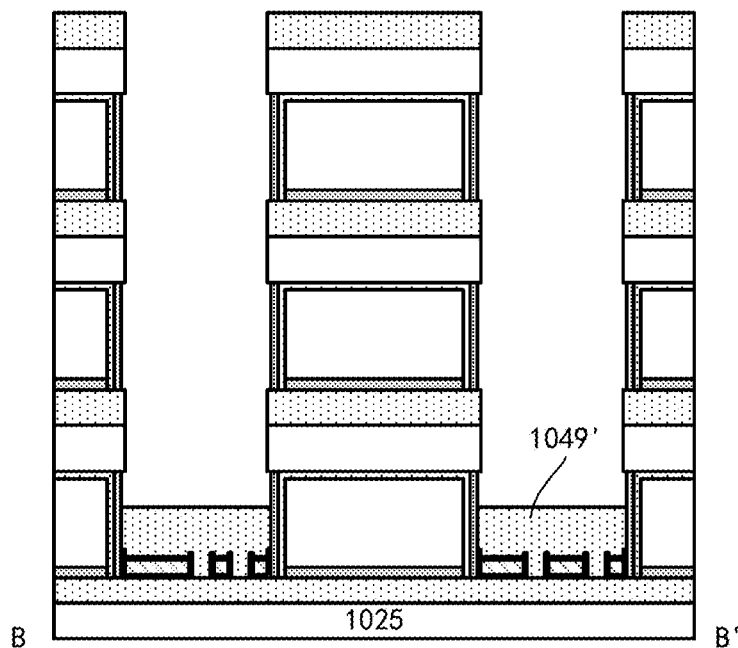

Here, the silicide 1015 is used to form the electrical connection to the source/drain layer. Therefore, the conductive structures to be formed for the source/drain layer may be located at a height corresponding to the silicide 1015. To this end, as shown in FIGS. 20(A) and 20(B), a top surface of the dielectric layer 1049 may be increased to the height corresponding to the silicide 1015 by depositing and then etching back for example, oxide (alternatively, a material different from that of the dielectric material 1049). The increased dielectric layer is marked as 1049' in the drawing. It should be noted that, although the dielectric layer 1049' is shown as a whole here, there may be an interface or boundary between successively formed dielectric layers.

Here, a height of a top surface of the dielectric layer 1049' may be set such that, on one hand, the sidewalls of the well region 1005 exposed in the trench O is blocked so as to prevent the conductive structures to be formed subsequently on the top surface of the dielectric layer 1049' from contacting the well region 1005 (the electrical connection to the well region 1005 may be achieved through the contact layer 1003); on the other hand, sidewalls of the silicide 1015 may be exposed in the trench O, so that the conductive structure to be formed subsequently on the top surface of the dielectric layer 1049' may contact the silicide 1015.

Figure 21:
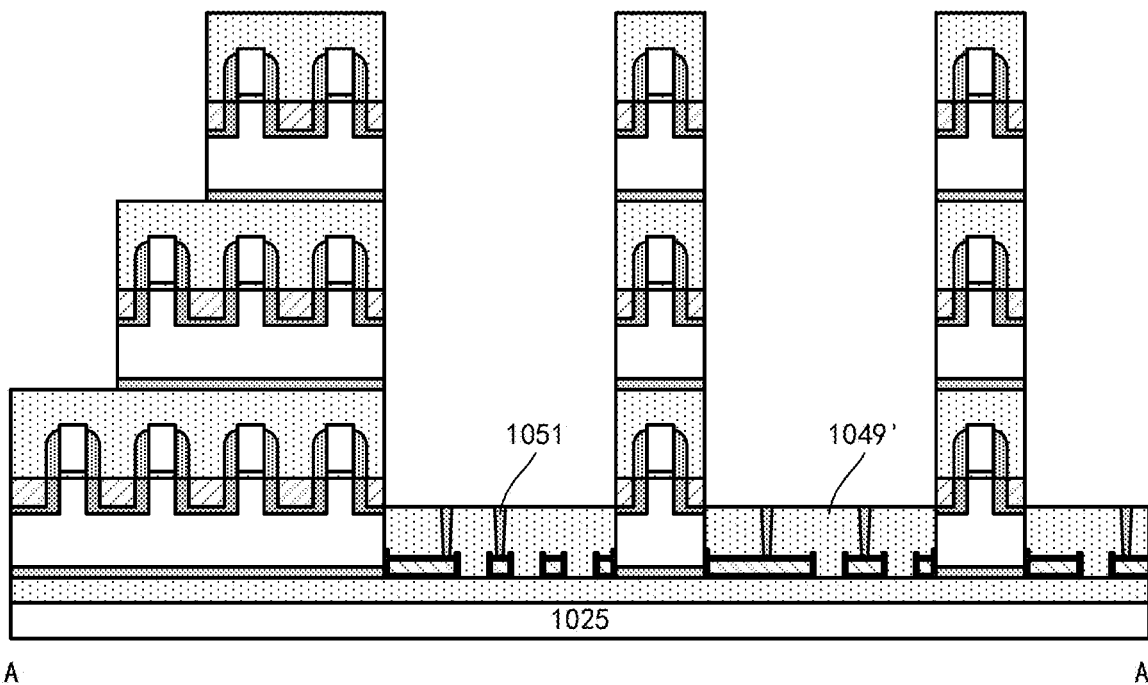

As shown in FIG. 21, via holes 1051 may be formed in the dielectric layer 1049' by, for example, etching holes and filling the holes with a conductive barrier layer such as conductive nitride and a conductive material such as metal. The via holes 1051 may achieve an electrical connection between upper and lower layers.

Figure 22A:
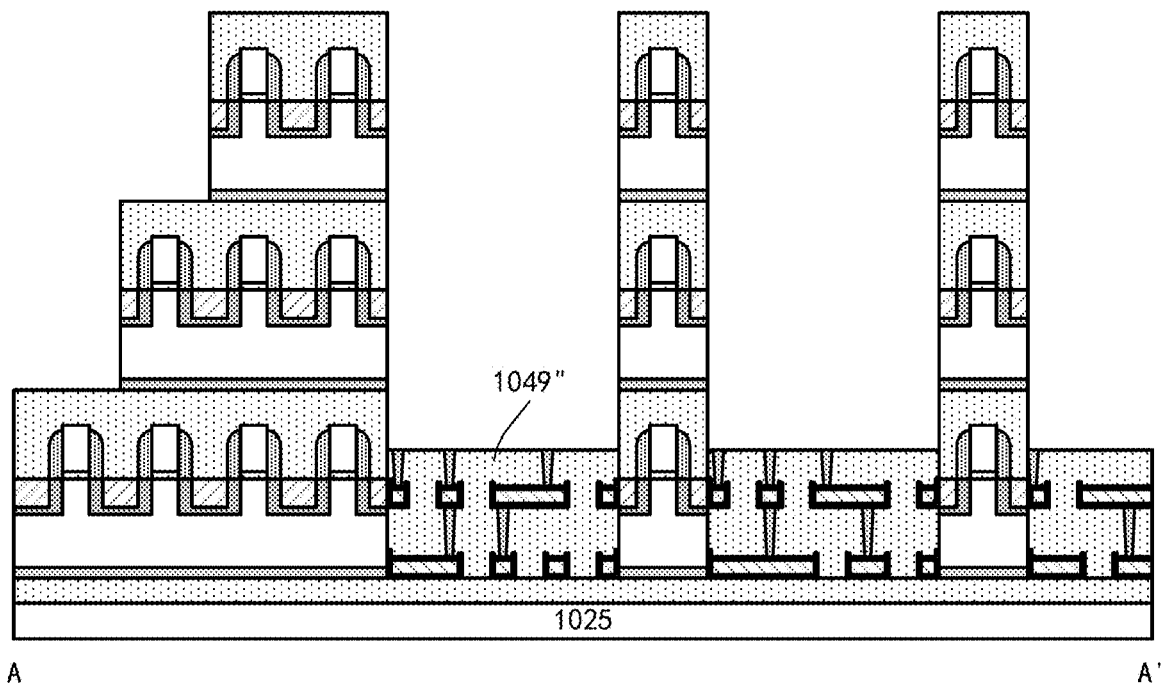
Figure 22B:
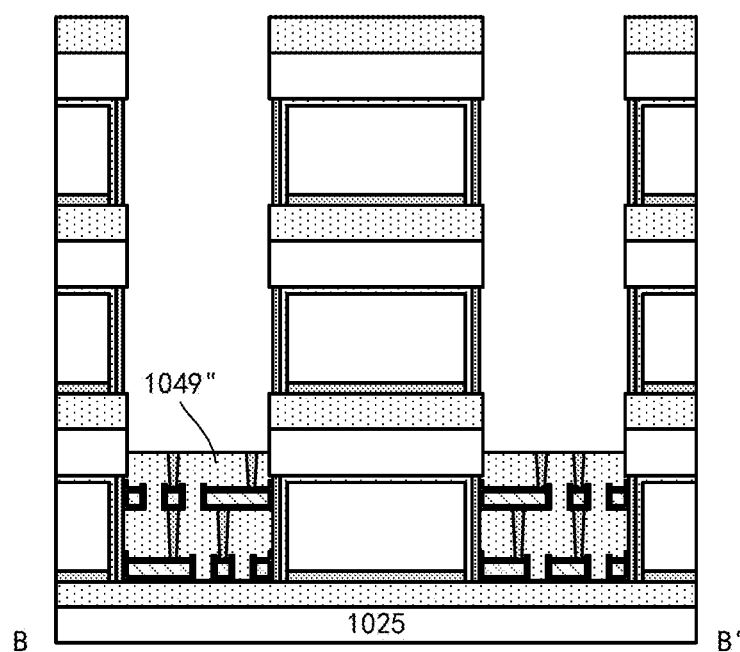

In addition, as shown in FIGS. 22(A) and 22(B), as described above in conjunction with FIGS. 8 to 19, conductive structures may be formed on the dielectric layer 1049'. Then, the height of the dielectric layer 1049' may be further increased to form the dielectric layer 1049". A height of a top surface of the dielectric layer 1049" may be set such that, on one hand, the sidewalls of the silicide 1015 exposed in the trench O is blocked so as to prevent the conductive structures to be formed subsequently on the top surface of the dielectric layer 1049" from contacting the silicide 1015 (the electrical connection to the silicide 1015 may be achieved through the previously formed conductive structures); on the other hand, sidewalls of the gate electrode 1009 may be exposed in the trench O, so that the conductive structure to be formed subsequently on the top surface of the dielectric layer 1049" may contact the gate electrode 1009. Similarly, via holes may be formed in the dielectric layer 1049". One or more of the via holes adjoining sidewalls of the element stack (for example, a rightmost via hole in the layer) may be in direct contact with the silicide 1015.

Similarly, the conductive structures for the gate electrode of the lowermost element in each element stack may be formed.

Figure 23:
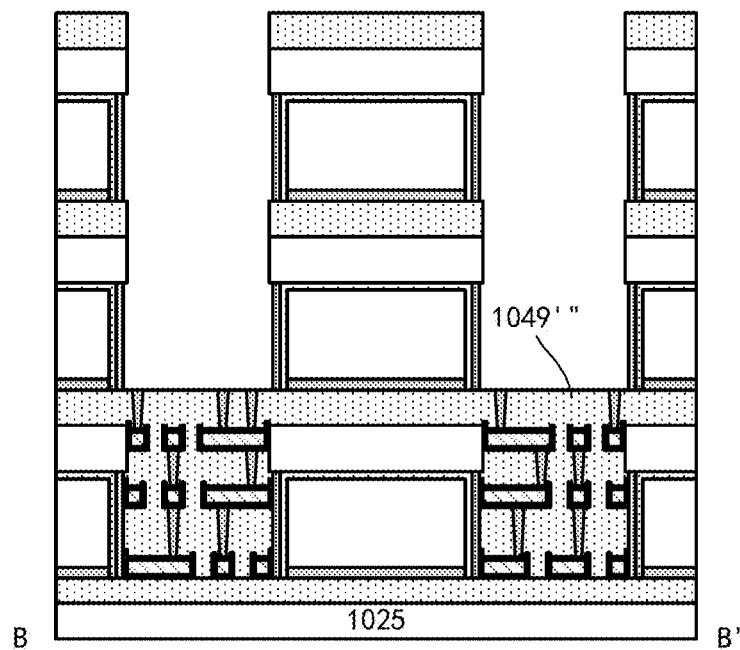

For example, as shown in FIG. 23, conductive structures are formed in the above-mentioned manner on the top surface of the dielectric layer 1049", and some conductive structures may be in contact and therefore electrically connected with the sidewalls of the gate electrode exposed in the trench O.

In addition, the top surface of the dielectric layer 1049" may be increased to a height corresponding to the upper element layer (here, the second element layer) to obtain a dielectric layer 1049'''. A top surface of the dielectric layer 1049''' may block the elements of the third element layer, but expose the elements of the second element layer, particularly the lowermost contact layer 1003 to be electrically connected. In the dielectric layer 1049''', via holes may be formed. Of course, there may be one or more via holes directly contacting the gate electrode.

Figure 24A:
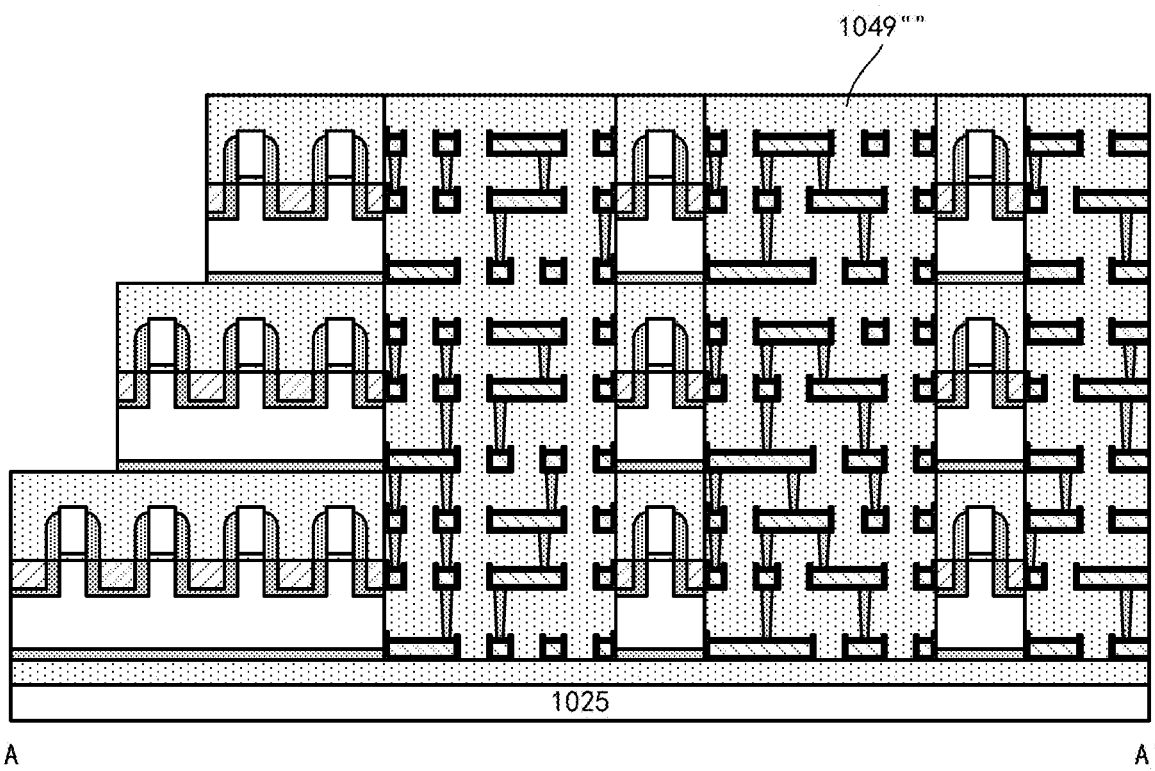
Figure 24B:
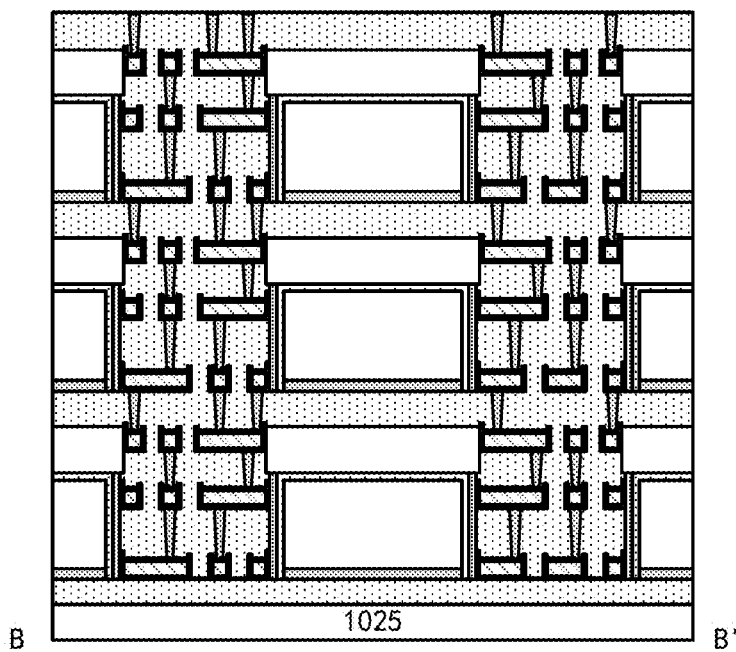

In this way, as shown in FIGS. 24(A) and 24(B), the conductive structures may be formed layer by layer, thereby forming the interconnection structure. Here, for the contact layer, silicide layer (or source/drain region) and the gate electrode in each element layer, corresponding conductive structures are formed at the corresponding heights to achieve the interconnections as required. In FIGS. 24(A) and 24(B), the dielectric layer between the conductive structures in the interconnection structure is labeled as 1049''''. At least a part of the aforementioned interfaces or boundaries in each layer may be substantially coplanar, for example, substantially aligned in the vertical direction.

Figure 25A:
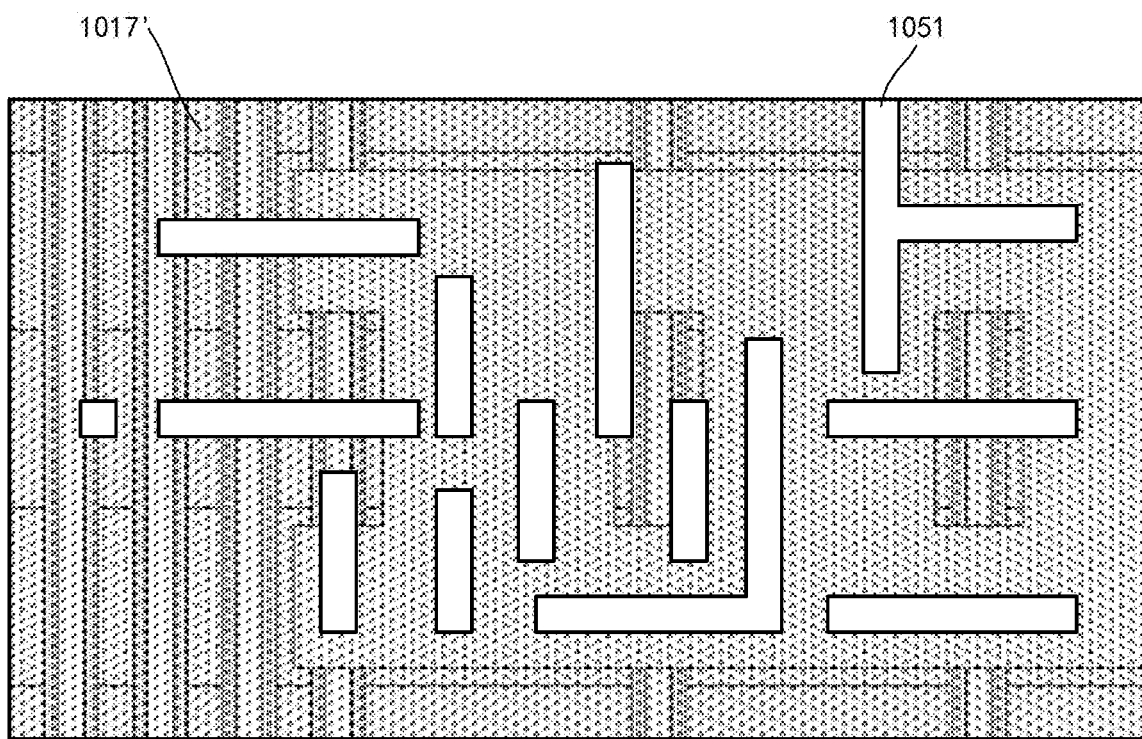
Figure 25B:
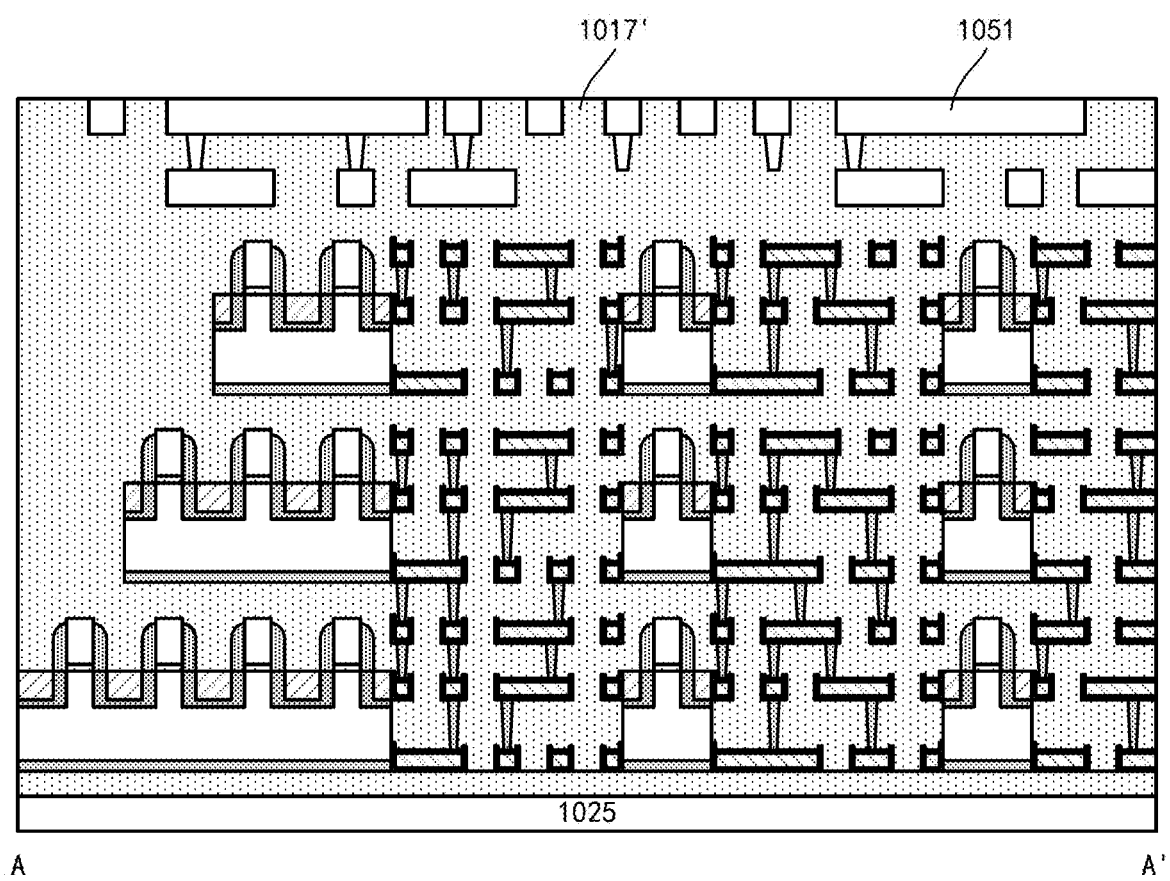
Figure 25C:
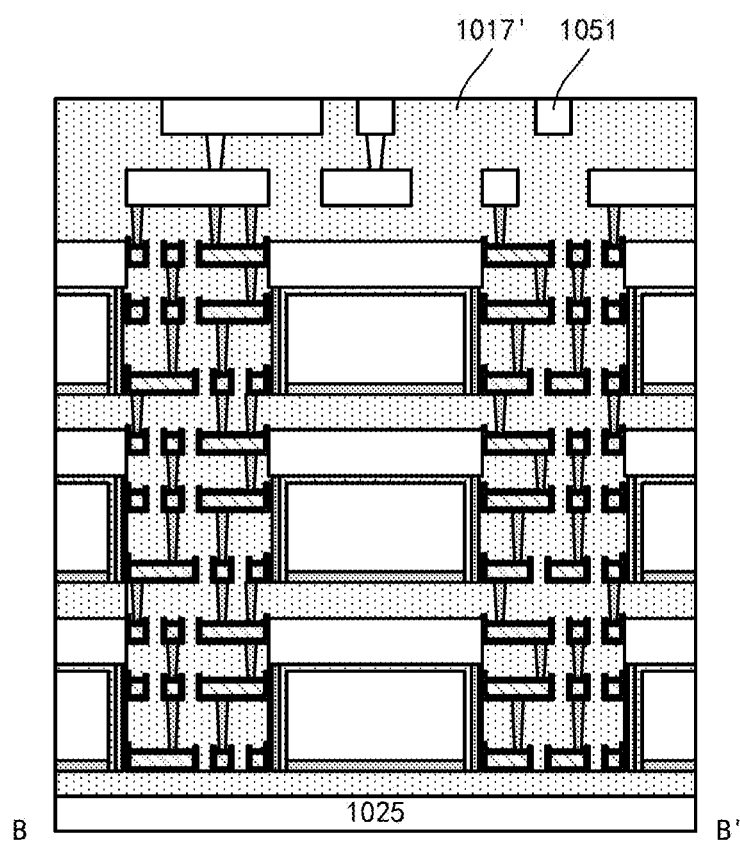

After that, lead terminals of the interconnection structure may be manufactured. For example, as shown in FIGS. 25(A), 25(B), and 25(C), an interlayer dielectric layer 1017' may be formed by, for example, depositing and planarizing a dielectric material such as an oxide, and an interconnection structure 1051 such as interconnection wires or via holes is formed in the interlayer dielectric layer 1017'. The interconnection structure 1051 and the previously formed interconnection structure in the trench O may be in contact and electrically connected.

The semiconductor device according to the embodiments of the present disclosure may be applied to various electronic apparatuses. Therefore, the present disclosure further provides an electronic apparatus including the above-mentioned semiconductor device. The electronic apparatus may also include components such as a display screen and a wireless transceiver, etc. Such electronic apparatus is for example a smart phone, a personal computer (PC), a tablet, an artificial intelligence apparatus, a wearable device, a mobile power supply, and so on.

According to the embodiments of the present disclosure, a method of manufacturing a system on chip (SoC) is further provided. The method may include the method described above. Specifically, a variety of elements may be integrated on the chip, at least some of which are manufactured according to the method of the present disclosure.

In the above description, technical details such as patterning and etching for each layer are not explained in detail. However, those skilled in the art should understand that various technical means may be used to form layers, regions, etc. of desired shapes. In addition, in order to form the same structure, those skilled in the art may also design a method that is not completely the same as the method described above. In addition, although each embodiment is described above respectively, this does not mean that the measures in each embodiment may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents.

Without departing from the scope of the present disclosure, those skilled in the art may make various substitutions and modifications, and these substitutions and modifications should fall within the scope of the present disclosure.

What is claimed is:

1. A semiconductor device, comprising:
   a plurality of element stacks, wherein each element stack comprises a plurality of stacked layers of semiconductor elements, each semiconductor element comprises a gate electrode and source/drain regions on opposite sides of the gate electrode; and
   an interconnection structure between the plurality of element stacks,
   wherein the interconnection structure comprises:
   an electrical isolation layer; and
   a conductive structure in the electrical isolation layer,
   wherein at least one of the gate electrode and the source/drain regions of each of at least a part of the semiconductor elements is in contact with and therefore electrically connected to the conductive structure of the interconnection structure at a corresponding height in a lateral direction.

2. The semiconductor device according to claim 1, wherein the conductive structure comprises at least one of an interconnection wire and a via hole.

3. The semiconductor device according to claim 2, wherein the conductive structure comprises an interconnection wire layer and a via hole layer that are alternately disposed, the interconnection wire is located in the interconnection wire layer, and the via hole is located in the via hole layer.

4. The semiconductor device according to claim 1, wherein the electrical isolation layer comprises a dielectric layer.

5. The semiconductor device according to claim 1, wherein the conductive structure comprises at least one of W, Co, Ru, Cu, Al, Ti, Ni, Ta.

6. The semiconductor device according to claim 1, wherein the semiconductor device further comprises a contact layer at a bottom, and the contact layer of each of at least a part of the semiconductor elements is in contact with and therefore electrically connected to the conductive structure of the interconnection structure at a corresponding height in the lateral direction.

7. The semiconductor device according to claim 1, wherein the interconnection structure surrounds at least a part of the semiconductor elements.

8. The semiconductor device according to claim 1, wherein active regions of the stacked semiconductor elements of at least a part of the element stacks are substantially aligned in a vertical direction.

9. The semiconductor device according to claim 1, wherein
   the source/drain regions of the semiconductor element are disposed on a first side and a second side of the active region that are opposite to each other, and
   the semiconductor element further comprises a third side and a fourth side of the active region that are opposite to each other, and a protective layer between the active region and the interconnection structure.

10. The semiconductor device according to claim 9, wherein the source/drain regions are connected to a corresponding conductive structure of the interconnection structure on at least one of the first side and the second side, and the gate electrode is connected to a corresponding conductive structure of the interconnection structure on at least one of the third side and the fourth side.

11. The semiconductor device according to claim 6, the source/drain regions are connected to a corresponding conductive structure of the interconnection structure on at least one of the first side and the second side, and the gate electrode is connected to a corresponding conductive structure of the interconnection structure on at least one of the third side and the fourth side, and the contact layer is connected to a corresponding conductive structure of the interconnection structure on at least one of the first side and the second side.

12. The semiconductor device according to claim 1, wherein there is an interface between the conductive structure of the interconnection structure and the element stack.

13. The semiconductor device according to claim 1, wherein there is an interface between the electrical isolation layer of the interconnection structure and the element stack.

14. The semiconductor device according to claim 12, wherein at least a part of the interface at different heights is substantially coplanar.

15. The semiconductor device according to claim 1, wherein
   the element stacks are arranged in a first direction and a second direction intersecting with each other, gate electrodes of the plurality of semiconductor elements extend in the first direction, and the source/drain regions of the plurality of semiconductor elements are arranged in the second direction.

16. The semiconductor device according to claim 15, wherein at least two gate electrodes adjacent in the first direction are connected to each other through a conductive material that extends in the first direction and is different from the gate electrode.

17. The semiconductor device according to claim 2, wherein the interconnection wire comprises a body portion and a barrier layer surrounding the body portion.

18. The semiconductor device according to claim 1, wherein respective semiconductor element layers in the plurality of element stacks at a corresponding height are substantially coplanar with one another in the lateral direction, and are provided with alignment marks at the corresponding height.

19. The semiconductor device according to claim 18, wherein the alignment marks in a lower layer are at least partially exposed by the alignment marks in an upper layer.

20. The semiconductor device according to claim 1, wherein the interconnection structure comprises a dummy conductive structure, a minimum gap between the conductive structures, a minimum gap between the conductive structure and the dummy conductive structure and a minimum gap between the dummy conductive structures in a same layer are kept substantially consistent in the same layer.

21. A method of manufacturing a semiconductor device, comprising:
   stacking a plurality of element layers on a substrate, wherein each element layer comprises a plurality of semiconductor elements in the element layer, each semiconductor element comprises a gate electrode and source/drain regions on opposite sides of the gate electrode;
   forming an opening penetrating the plurality of element layers;
   forming an interconnection structure in the opening, wherein the interconnection structure comprises an electrical isolation layer and a conductive structure in the electrical isolation layer, wherein the method further comprises: controlling a height of the conductive structure of the interconnection structure, so that at least one of the gate electrode and the source/drain regions of each of at least a part of the semiconductor elements is in contact with and therefore electrically connected to the conductive structure of the interconnection structure at a corresponding height in a lateral direction.

22. The method according to claim 21, wherein at least a part of the element layers further comprise a contact layer at a bottom, and wherein the method further comprises: further controlling a height of conductive structure of the interconnection structure, so that at least a part of the contact layer is in contact with and therefore electrically connected to the conductive structure at a corresponding height in the lateral direction.

23. The method according to claim 21, wherein the forming the interconnection structure comprises:
  forming an interconnection wire layer and a via hole layer alternately, wherein an interconnection wire is disposed in the interconnection wire layer, and a via hole is disposed in the via hole layer.

24. The method according to claim 23, wherein the forming an interconnection wire layer and a via hole layer comprises:
  forming the interconnection wire in the opening at a first height, wherein the first height is provided such that the interconnection wire and the gate electrode or the source/drain regions of a corresponding semiconductor element are located at a substantially same height;
  filling the opening with a dielectric material to bury the interconnection wire, wherein a top surface of the dielectric material is located at a second height, and the second height is provided such that the interconnection wire to be formed subsequently on the dielectric material and the gate electrode or the source/drain regions of the corresponding semiconductor elements are located at a substantially same height; and
  forming the via hole in the dielectric material.

25. The method according to claim 24, wherein the forming the interconnection wire comprises:
  forming a conductive material layer;
  patterning the conductive material layer into a plurality of line patterns, wherein at least some of the line patterns form the interconnection wire,
  wherein a minimum gap among the line patterns is kept substantially consistent.

26. The method according to claim 25, further comprising:
  forming a conductive barrier layer surrounding the line patterns.

27. The method according to claim 23, wherein each element layer further comprises an alignment mark, and the alignment mark at the corresponding height is referenced when each of the interconnection wire layer and the via hole layer is formed.

28. An electronic apparatus, comprising the semiconductor device according to claim 1.

29. The electronic apparatus according to claim 28, wherein the electronic apparatus comprises a smart phone, a personal computer, a tablet, an artificial intelligence apparatus, a wearable apparatus or a mobile power supply.

* * * * *